(12) United States Patent
Lai et al.

(10) Patent No.: US 11,856,779 B2
(45) Date of Patent: Dec. 26, 2023

(54) SEMICONDUCTOR DEVICE, MEMORY ARRAY AND METHOD OF FORMING THE SAME

(71) Applicant: Taiwan Semiconductor Manufacturing Company, Ltd., Hsinchu (TW)

(72) Inventors: Sheng-Chih Lai, Hsinchu County (TW); Chung-Te Lin, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/853,922

(22) Filed: Jun. 30, 2022

(65) Prior Publication Data

US 2022/0336475 A1 Oct. 20, 2022

Related U.S. Application Data

(62) Division of application No. 16/886,732, filed on May 28, 2020, now Pat. No. 11,437,393.

(51) Int. Cl.
*H10B 43/35* (2023.01)
*H01L 23/522* (2006.01)
(Continued)

(52) U.S. Cl.
CPC ......... *H10B 43/35* (2023.02); *H01L 23/5226* (2013.01); *H10B 43/10* (2023.02);
(Continued)

(58) Field of Classification Search
CPC ........... H01L 27/11578; H01L 27/1157; H01L 27/11565; H01L 23/5226; H01L 27/11551; H01L 27/11519; H01L 27/11524; H01L 27/11573; H01L 27/11575; H01L 27/11582; H01L 27/11556; H01L 2924/1438; H01L 2924/145; H10B 43/35; H10B 43/20
See application file for complete search history.

(56) References Cited

U.S. PATENT DOCUMENTS 7,816,727 B2 * 10/2010 Lai .................... H01L 29/40117
257/411
2011/0303968 A1 * 12/2011 Lue ................... H01L 29/66833
257/E21.423
(Continued)

*Primary Examiner* — Steven B Gauthier
*Assistant Examiner* — Khatib A Rahman
(74) *Attorney, Agent, or Firm* — JCIPRNET

(57) ABSTRACT

A memory array includes a plurality of memory cells stacked up along a first direction. Each of the memory cells include a memory stack, connecting lines, and insulating layers. The memory stack includes a first dielectric layer, a channel layer disposed on the first dielectric layer, a charge trapping layer disposed on the channel layer, a second dielectric layer disposed on the charge trapping layer, and a gate layer disposed in between the channel layer and the second dielectric layer. The connecting lines are extending along the first direction and covering side surfaces of the memory stack. The insulating layers are extending along the first direction, wherein the insulating layers are located aside the connecting lines and covering the side surfaces of the memory stack.

20 Claims, 31 Drawing Sheets

(51) Int. Cl.
*H10B 43/10* (2023.01)
*H10B 43/20* (2023.01)

(52) U.S. Cl.
CPC ........ *H10B 43/20* (2023.02); *H01L 2924/145* (2013.01); *H01L 2924/1438* (2013.01)

(56) References Cited

U.S. PATENT DOCUMENTS

| | | | |
|---|---|---|---|
| 2020/0098776 A1* | 3/2020 | Sugisaki | H10B 43/10 |
| 2021/0098485 A1* | 4/2021 | Bin | H10B 43/27 |
| 2021/0143163 A1* | 5/2021 | Leobandung | H01L 21/76877 |

\* cited by examiner

SEMICONDUCTOR DEVICE, MEMORY ARRAY AND METHOD OF FORMING THE SAME

CROSS-REFERENCE TO RELATED APPLICATION

This application is a divisional application of U.S. application Ser. No. 16/886,732, filed on May 28, 2020, now allowed. The entirety of the above-mentioned patent application is hereby incorporated by reference herein and made a part of this specification.

BACKGROUND

Flash memory has become a powerful and cost-effective solid-state storage technology widely used in mobile electronics and other consumer applications. NAND flash and NOR flash are two major forms of flash memory. In the internal circuit configuration of NOR flash, the individual memory cells are connected in parallel, and this configuration enables a short read time. As such, NOR flash is ideal for high-speed read applications, which are often referred to as code-storage applications. However, NOR flash is currently formed as a two-dimensional structure, such that a cell density of NOR flash is limited.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1A:
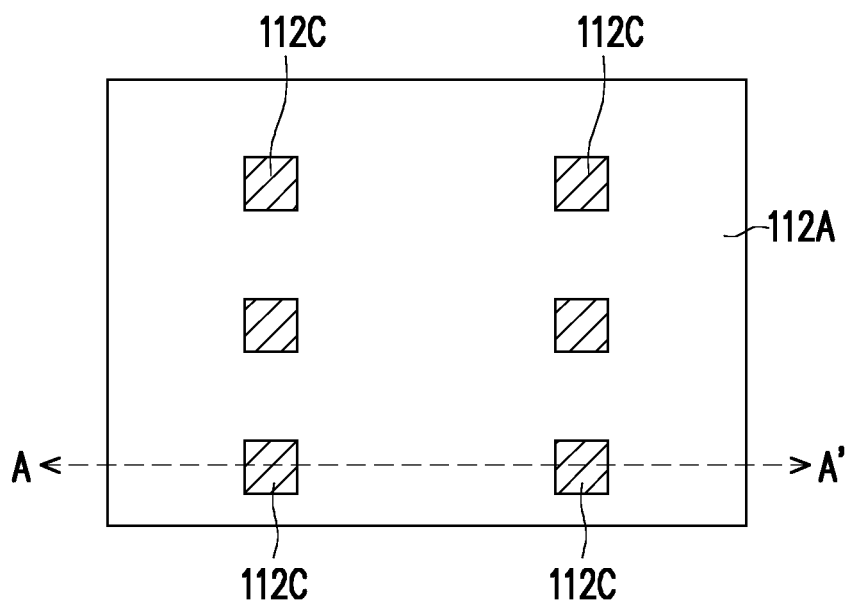
FIG. 1A to FIG. 21C are schematic top views and sectional views of various stages in a method of fabricating a semiconductor device according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A to FIG. 21C are schematic top views and sectional views of various stages in a method of fabricating a semiconductor device according to some embodiments of the present disclosure. Embodiments will be described with respect to a specific context, namely a semiconductor device, such as a NOR flash memory device. Other embodiments may also be applied, however, to other circuits and layouts. Throughout the various views and illustrative embodiments, like reference numbers are used to designate like elements.

Figure 1B:
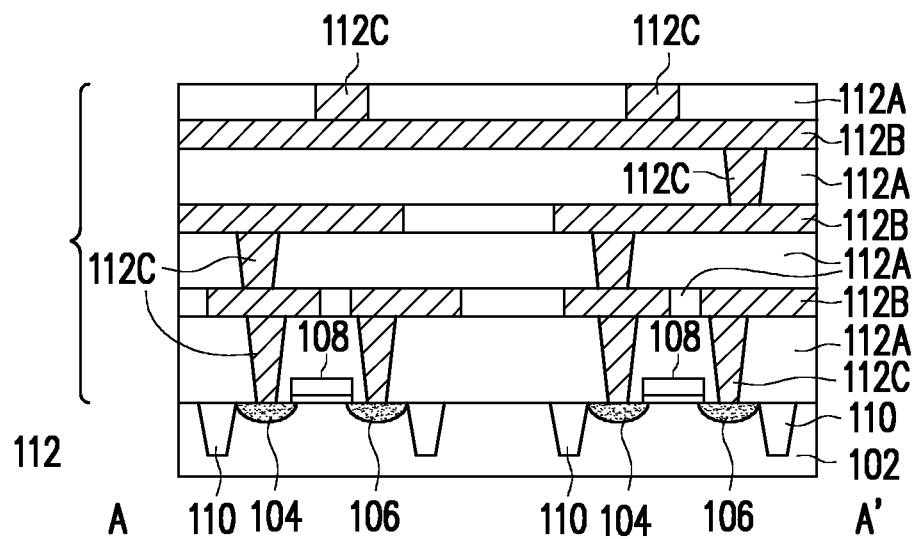

FIG. 1A is a top view of one stage in a method of fabricating a semiconductor device according to some embodiments of the present disclosure. FIG. 1B is a sectional view of the structure shown in FIG. 1A taken along the line A-A'. Referring to FIG. 1A and FIG. 1B, a substrate 102 is provided. The substrate 102 may include a semiconductor wafer, a semiconductor-on-insulator (SOI) wafer or an epitaxial wafer. The substrate 102 may be doped (e.g., with a p-type or an n-type dopant) or undoped. In some embodiments, the semiconductor wafer, the SOI wafer or the epitaxial wafer include an elemental semiconductor material or a compound semiconductor material. For instance, the elemental semiconductor may include Si or Ge. The compound semiconductor may include SiGe, SiC, SiGeC, a III-V semiconductor or a II-VI semiconductor. For instance, the III-V semiconductor includes GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs or InAlPAs. The II-VI semiconductor may include CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnSe, CdZnSeS, CdZnSeTe, CdZnSTe, CdHgSeS, CdHgSeTe, CdHgSTe, HgZnSeS, HgZnSeTe or HgZnSTe.

In some embodiments, transistors are formed on the substrate 102. For example, the transistors include source and drain regions 104, 106 and a gate stack 108. The source and drain regions 104 may extend into the substrate 102, or is embedded in the substrate 102. The gate stack 108 is disposed on the substrate 102, and may include a gate dielectric and a gate electrode. In some embodiments, isolation structures 110 such as shallow trench isolation (STI) structures are located in the substrate 102.

As further illustrated in FIG. 1B, a first interconnection layer 112 is disposed on the substrate 102 over the gate stack 108. For example, the first interconnection layer 112 is connected to the source and drain regions 104, 106. In some embodiments, the first interconnection layer 112 includes a plurality of first inter-metal dielectric layers 112A, a plurality of first conductive layer 112B and a plurality of first conductive vias 112C alternately stacked.

In some embodiments, the first inter-metal dielectric layers 112A are made of dielectric materials, such as silicon oxide, silicon nitride, silicon oxynitride, a spin-on dielectric material, or a low-k dielectric material, which may be patterned using a photolithography and/or etching process. It should be noted that the low-k dielectric materials are generally dielectric materials having a dielectric constant lower than 3.9. In certain embodiments, the first inter-metal dielectric layers 112A are formed by suitable fabrication techniques such as spin-on coating, chemical vapor deposition (CVD), plasma-enhanced chemical vapor deposition (PECVD) or the like. The disclosure is not limited thereto.

In some embodiments, the first conductive layer 112B and the first conductive vias 112C are formed by electroplating or deposition. In certain embodiments, the first conductive layer 112B and the first conductive vias 112C are made of conductive materials, such as metals or metal alloys including one or more of Al, AlCu, Cu, Ti, TiN, W, and the like, which may be patterned using a photolithography and etching process. In certain embodiments, the first conductive layer 112B and the first conductive vias 112C forms a portion of a current driving circuit (not shown) to provide current to a memory array (including memory cells) formed in subsequent steps.

As illustrated in FIG. 1A and FIG. 1B, the gate stack 108 may be covered or surrounded by the first inter-metal dielectric layers 112A. The first interconnection layer 112 may be connected to the source and drain regions 104, 106 through the first conductive vias 112C. Furthermore, the first conductive layer 112B and the first conductive vias 112C are disposed in and surrounded by the first inter-metal dielectric layers 112A. As illustrated in FIG. 1A, first conductive vias 112C may be exposed at top surfaces of the first interconnection layer 112 for providing electrical connection to the above components. In the exemplary embodiment, components in the substrate 102 and the first interconnection layer 112 are parts of a complementary metal oxide semiconductor (CMOS) circuitry. For example, the CMOS circuitry typically include a N-type metal-oxide semiconductor (NMOS) and a P-type metal-oxide semiconductor (PMOS).

Figure 2A:
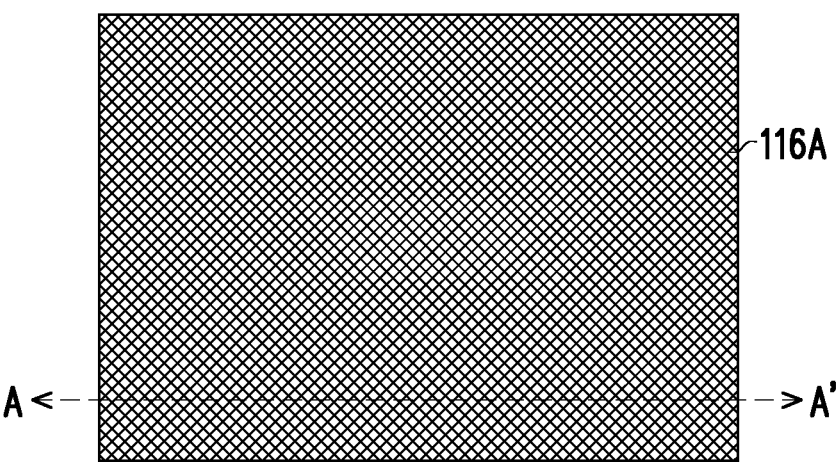
Figure 2B:
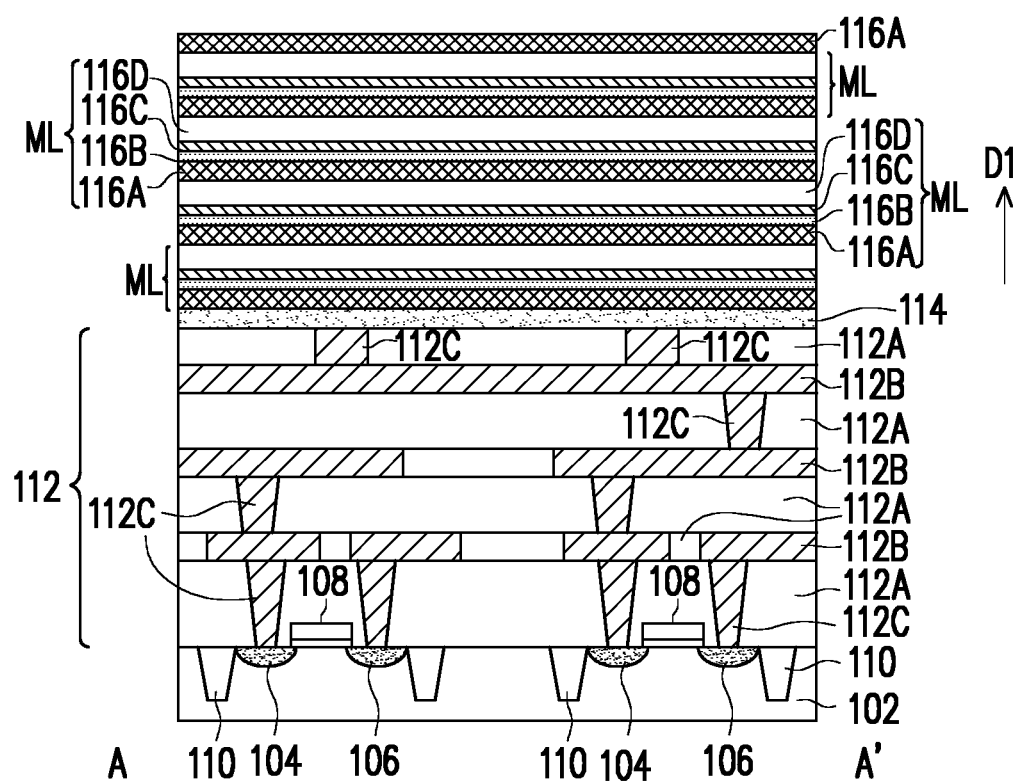

FIG. 2A is a top view of one stage in a method of fabricating a semiconductor device according to some embodiments of the present disclosure. FIG. 2B is a sectional view of the structure shown in FIG. 2A taken along the line A-A'. Referring to FIG. 2A and FIG. 2B, after forming the first interconnection layer 112, an etching stop layer 114 is formed over the first interconnection layer 112 to cover the first interconnection layer 112. In some embodiments, the etching stop layer 114 includes SiC, SiN, SiON, HfO$_x$, ZrO$_x$, LaO$_x$, or a combination thereof. The etching stop layer 114 may be formed by any suitable method, such as chemical vapor deposition (CVD), or the like.

After forming the etching stop layer 114, a plurality of memory layers ML (stacked memory layers) is formed on the etching stop layer 114 over the substrate 102. In some embodiments, each of the memory layers ML are formed by sequentially forming a dielectric material 116A, a channel material 116B, a charge trapping material 116C and a gate material 116D over the etching stop layer 114. The formation of the dielectric material 116A, the channel material 116B, the charge trapping material 116C and the gate material 116D are repeated so as to form the plurality of memory layers ML. In some embodiments, the dielectric material 116A, the channel material 116B, the charge trapping material 116C and the gate material 116D may respectively be formed by any suitable methods such as spin-coating, lamination, chemical vapor deposition (CVD), physical vapor deposition (PVD), plating, the like, or combinations thereof.

In some embodiments, the dielectric material 116A is different than a material of the etching stop layer 114, and include materials such as silicon oxide, silicon nitride, silicon oxynitride, a spin-on dielectric material, or a low-k dielectric material, or the like. In some embodiments, the channel material 116B includes doped or intrinsic semiconductor material, such as polysilicon, SiGe, SiC or the like. In some other embodiments, the channel material 116B includes oxide semiconductors, such as InGaZnO, InZnO, or the like. The charge trapping material 116C may include multilayer dielectric charge trapping materials commonly used in flash memory technology, such as oxide-nitride-oxide (ONO), oxide-nitride-oxide-nitride-oxide (ONONO), oxide-nitride-oxide-nitride-oxide-nitride-oxide (ONONONO), silicon-oxide-nitride-oxide-silicon (SONOS), bandgap engineered silicon-oxide-nitride-oxide-silicon (BE-SONOS), or ferroelectric films, such as HfZrO, HfAlO, or the like. In some embodiments, the gate material 116D includes a metal material, such as W, TiN, Mo, the like, or combinations thereof. In some other embodiments, the gate material 116D includes doped polysilicon.

As illustrated in FIG. 2A and FIG. 2B, the channel material 116B is stacked over the dielectric material 116A, the charge trapping material 116C is stacked over the channel material 116B, and the gate material 116D is stacked over the charge trapping material 116C along a first direction D1 to constitute one memory layer ML. In the illustrated embodiment, four memory layers ML are shown to be stacked over one another. However, the disclosure is not limited thereto, and the number of stacked memory layers ML may be adjusted based on product requirement. For example, in one exemplary embodiment, there may be hundreds of memory layers ML stacked over one another. After forming the plurality of memory layers ML, another dielectric material 116A is formed to cover the topmost gate material 116D to complete the formation of the stacked memory layers ML.

Figure 3A:
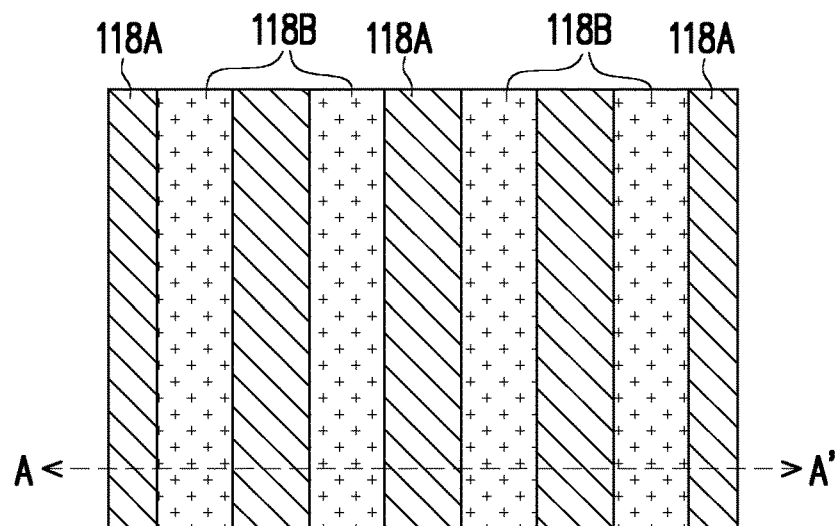
Figure 3B:
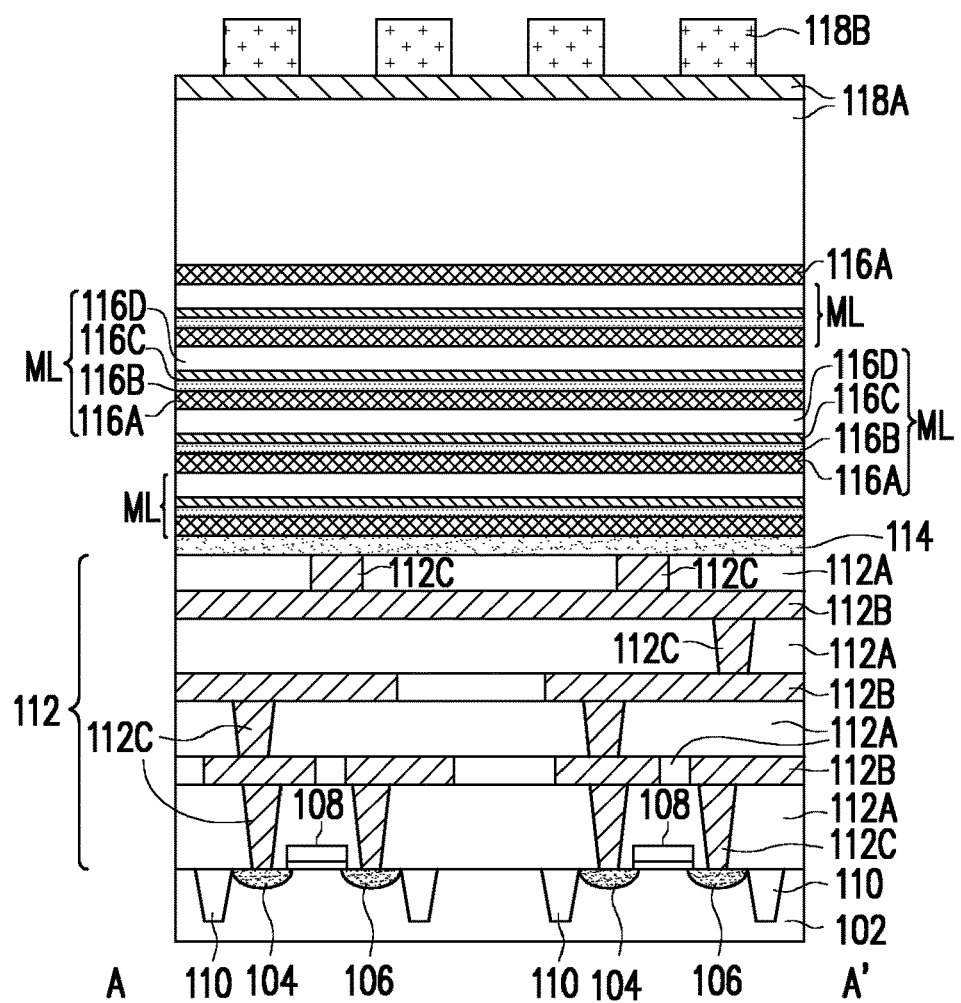

FIG. 3A is a top view of one stage in a method of fabricating a semiconductor device according to some embodiments of the present disclosure. FIG. 3B is a sectional view of the structure shown in FIG. 3A taken along the line A-A'. Referring to FIG. 3A and FIG. 3B, after forming the plurality of memory layers ML, mask layers 118A and a patterned photoresist layer 118B are formed over the plurality of memory layers ML. In some embodiments, a pad layer (not shown) may be formed between the mask layers 118A and the memory layers ML to act as an adhesion layer between the mask layers 118A and the memory layers ML. The pad layer may be a silicon oxide thin film formed, for example, by thermal oxidation process. In some embodiments, the pad layer may also act as an etch stop layer while etching the mask layers 118A. In some embodiments, the mask layers 118A are silicon nitride layers, or silicon oxide layers formed, for example, by low-pressure chemical vapor deposition (LPCVD) or plasma enhanced chemical vapor deposition (PECVD). The mask layers 118A are used as a hard mask during subsequent photolithography processes. In certain embodiments, the patterned photoresist layer 118B having a predetermined pattern is formed on the mask layers 118A.

Figure 4A:
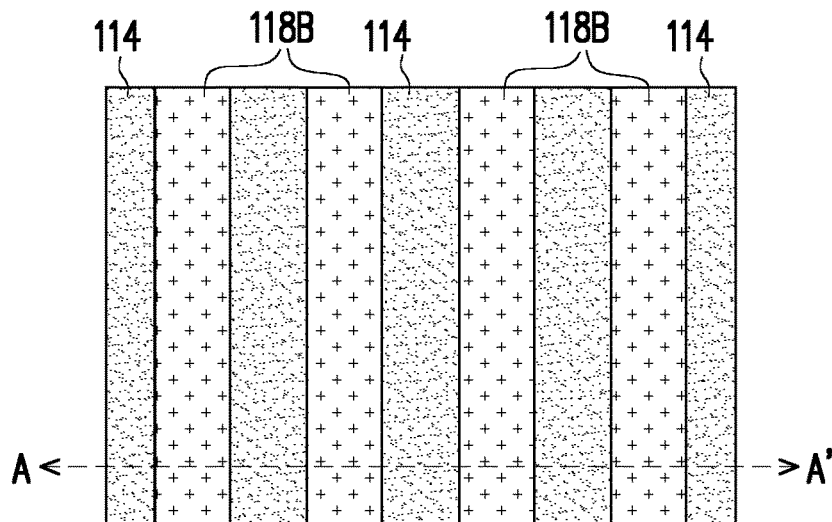
Figure 4B:
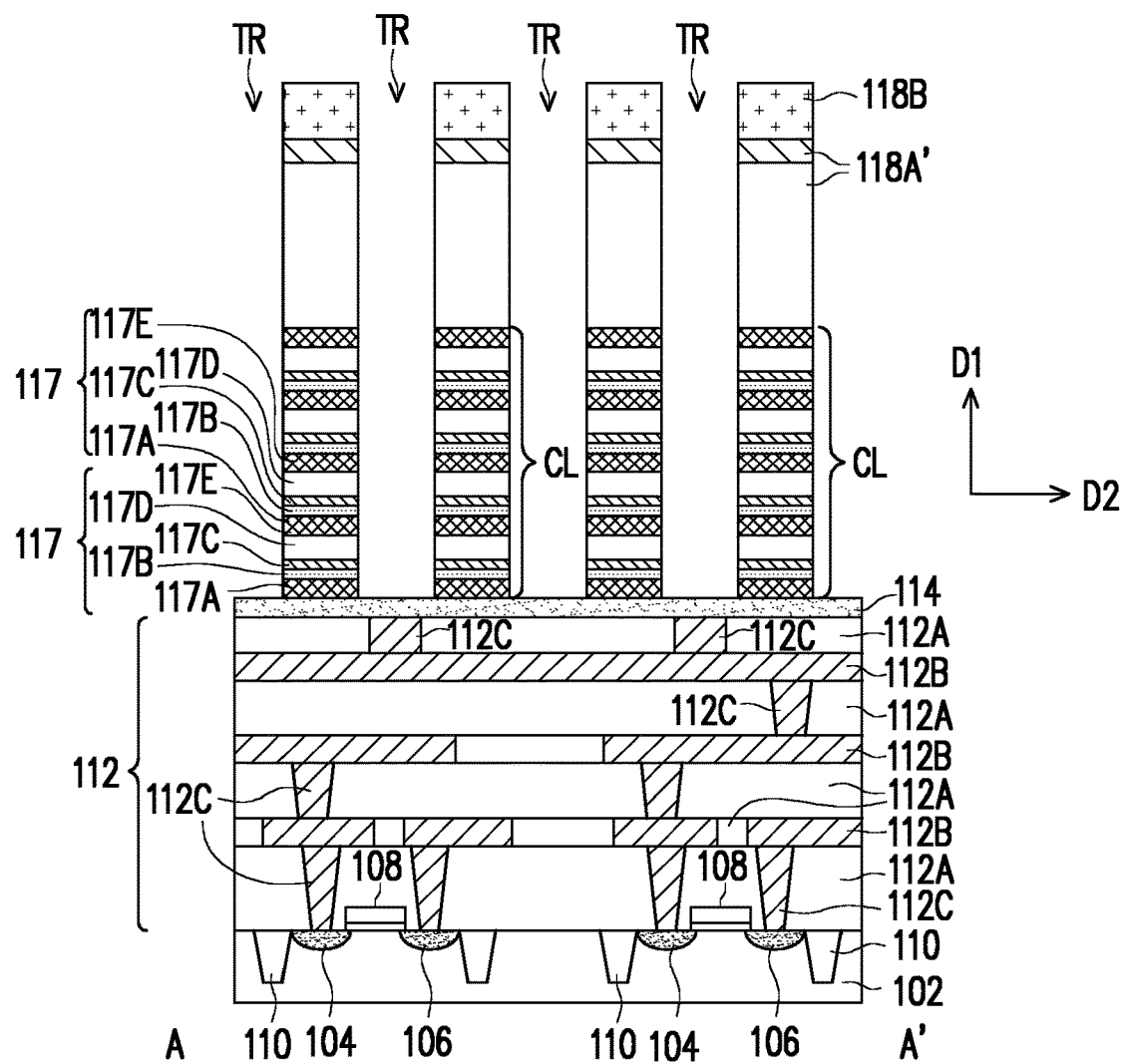

FIG. 4A is a top view of one stage in a method of fabricating a semiconductor device according to some embodiments of the present disclosure. FIG. 4B is a sectional view of the structure shown in FIG. 4A taken along the line A-A'. Referring to FIG. 4A and FIG. 4B, in a subsequent step, the memory layers ML are patterned to form a plurality of column structures CL and a plurality of first trenches TR in between the plurality of column structures CL. For example, the mask layers 118A and portions of the memory layers ML not covered by the patterned photoresist layer 118B are sequentially etched to expose the etching stop layer 114. In the exemplary embodiment, the mask layers 118A are etched to form patterned mask layers 118A', while the memory layers ML are etched to form the plurality of column structures CL. In some embodiments, the etching process may be a wet etching process with hydrofluoric acid (HF) or a dry etching process.

As illustrated in FIG. 4A and FIG. 4B, the column structures CL are covered by the patterned mask layers 118A' and the patterned photoresist layer 118B. In some embodiments, each of the column structures CL includes a plurality of memory stacks 117 stacked up along a first direction D1. Furthermore, the column structures CL are arranged along a second direction D2 and spaced apart from one another by the first trenches TR, wherein the second direction D2 is perpendicular to the first direction D1. In some embodiments, each of the memory stacks 117 includes a first dielectric layer 117A, a channel layer 117B, a charge trapping layer 117C, a gate layer 117D (or word line) and a second dielectric layer 117E stacked up in sequence. For example, the first dielectric layer 117A and the second dielectric layer 117E are formed by patterning the dielectric material 116A, the channel layer 117B is formed by patterning the channel material 116B, the change trapping layer 117C is formed by patterning the charge trapping material 116C, and the gate layer 117D is formed by patterning the gate material 116D. In some embodiments, the second dielectric layer 117E of one of the memory stacks 117 corresponds to a first dielectric layer 117A of another one of the memory stacks 117 located above. In other words, the first dielectric layer 117A and/or the second dielectric layer 117E may be shared between the memory stacks 117.

Figure 5A:
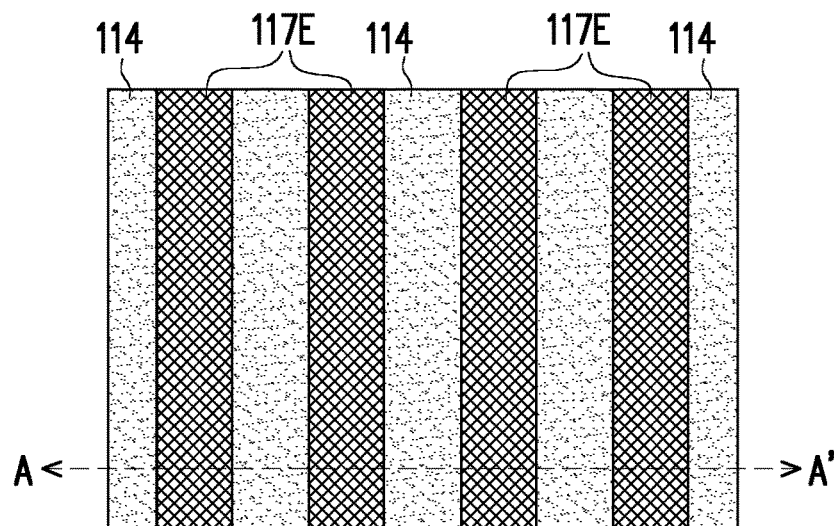
Figure 5B:
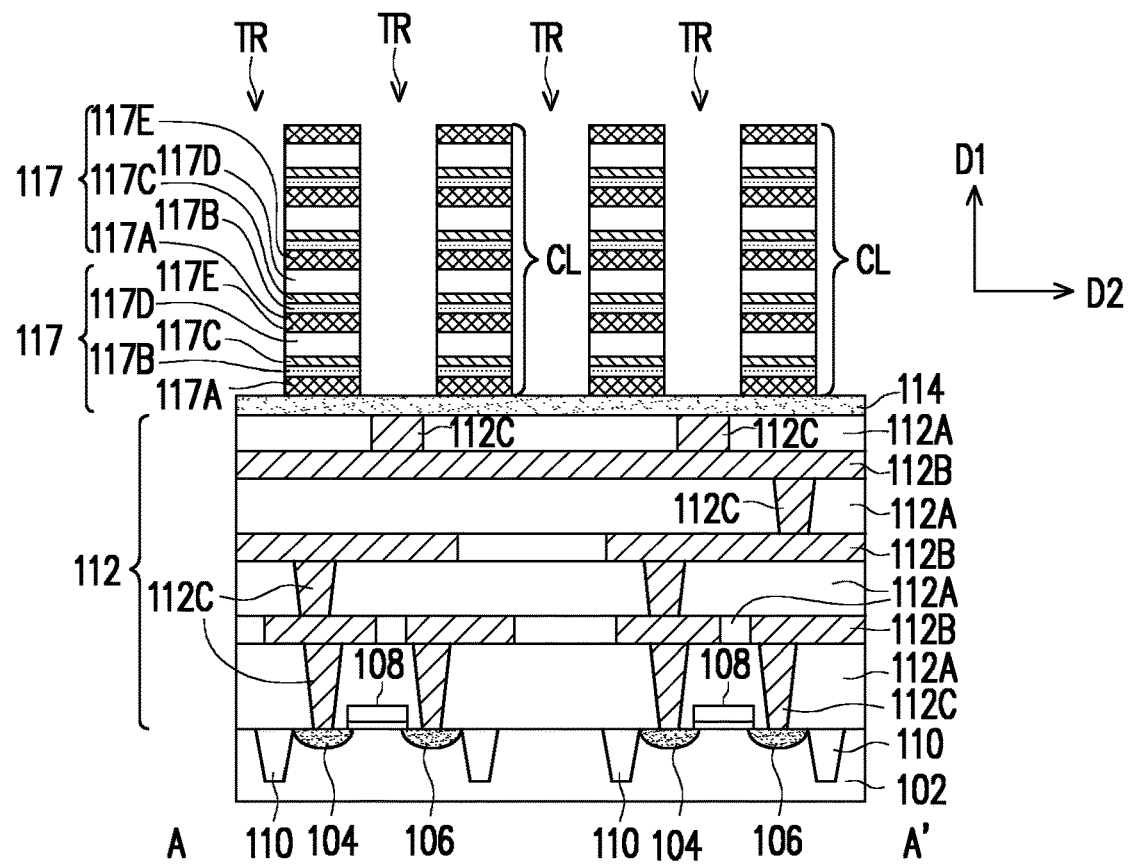

FIG. 5A is a top view of one stage in a method of fabricating a semiconductor device according to some embodiments of the present disclosure. FIG. 5B is a sectional view of the structure shown in FIG. 5A taken along the line A-A'. Referring to FIG. 5A and FIG. 5B, after patterning the memory layers ML to form the column structures CL, the patterned mask layers 118A' and the patterned photoresist layer 118B are removed. For example, the patterned mask layers 118A' and the patterned photoresist layer 118B are removed to reveal the topmost dielectric layer (second dielectric layer 117E) of the column structures CL.

Figure 6A:
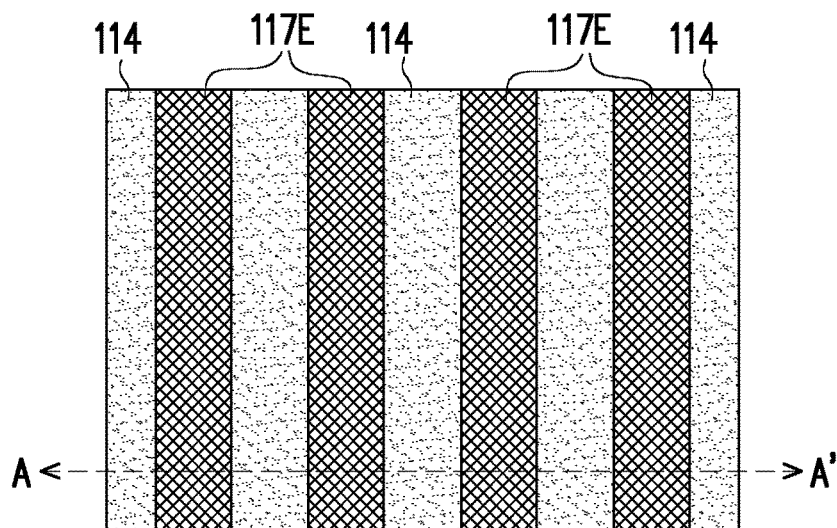
Figure 6B:
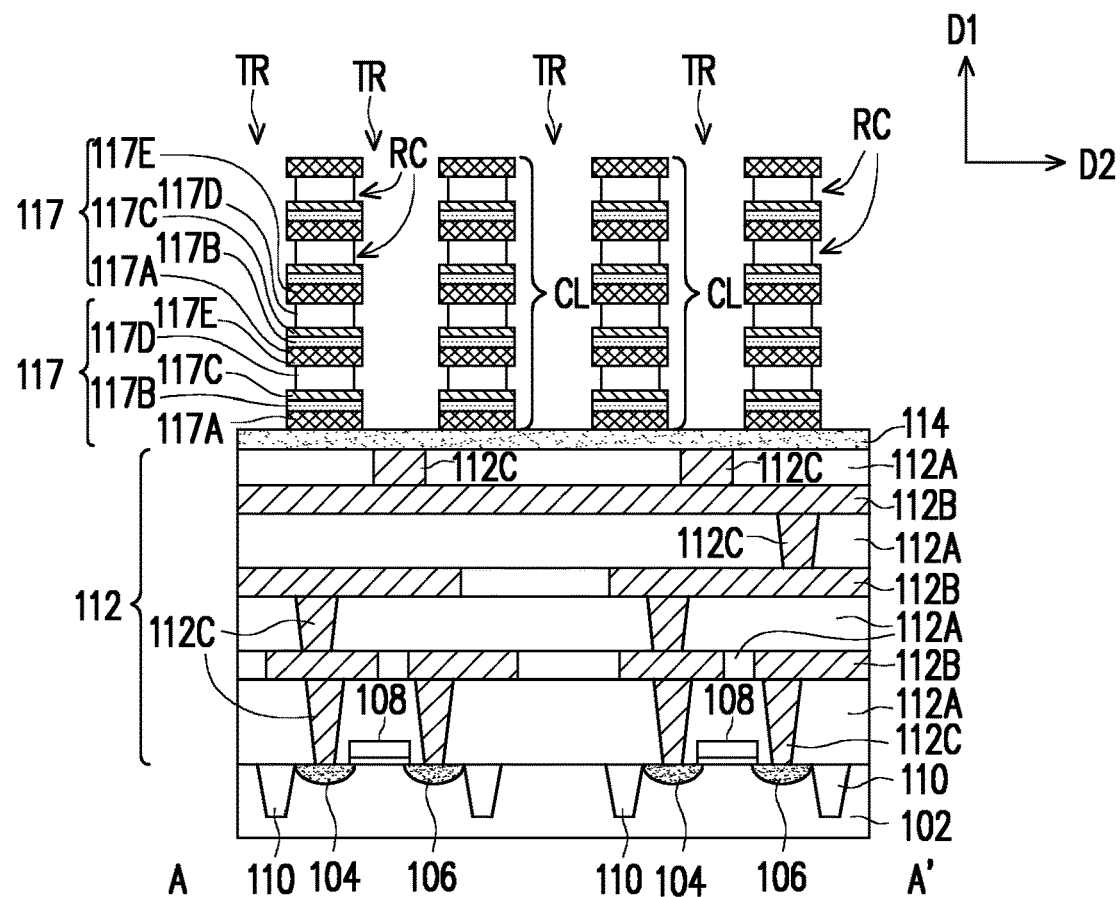

FIG. 6A is a top view of one stage in a method of fabricating a semiconductor device according to some embodiments of the present disclosure. FIG. 6B is a sectional view of the structure shown in FIG. 6A taken along the line A-A'. Referring to FIG. 6A and FIG. 6B, in a subsequent step, lateral etching is performed to remove portions of the gate layer 117D to form a plurality of recesses Rc in the column structures CL. For example, isotropic etching is performed to laterally remove portions of the gate layer 117D to form the plurality of recesses Rc. In some embodiments, wet etching or dry etching is performed depending on a material of the gate layer 117D. Furthermore, all the gate layer 117D in each of the memory stacks 117 are partially removed so that sidewalls of the gate layer 117D are recessed from the memory stacks 117.

Figure 7:
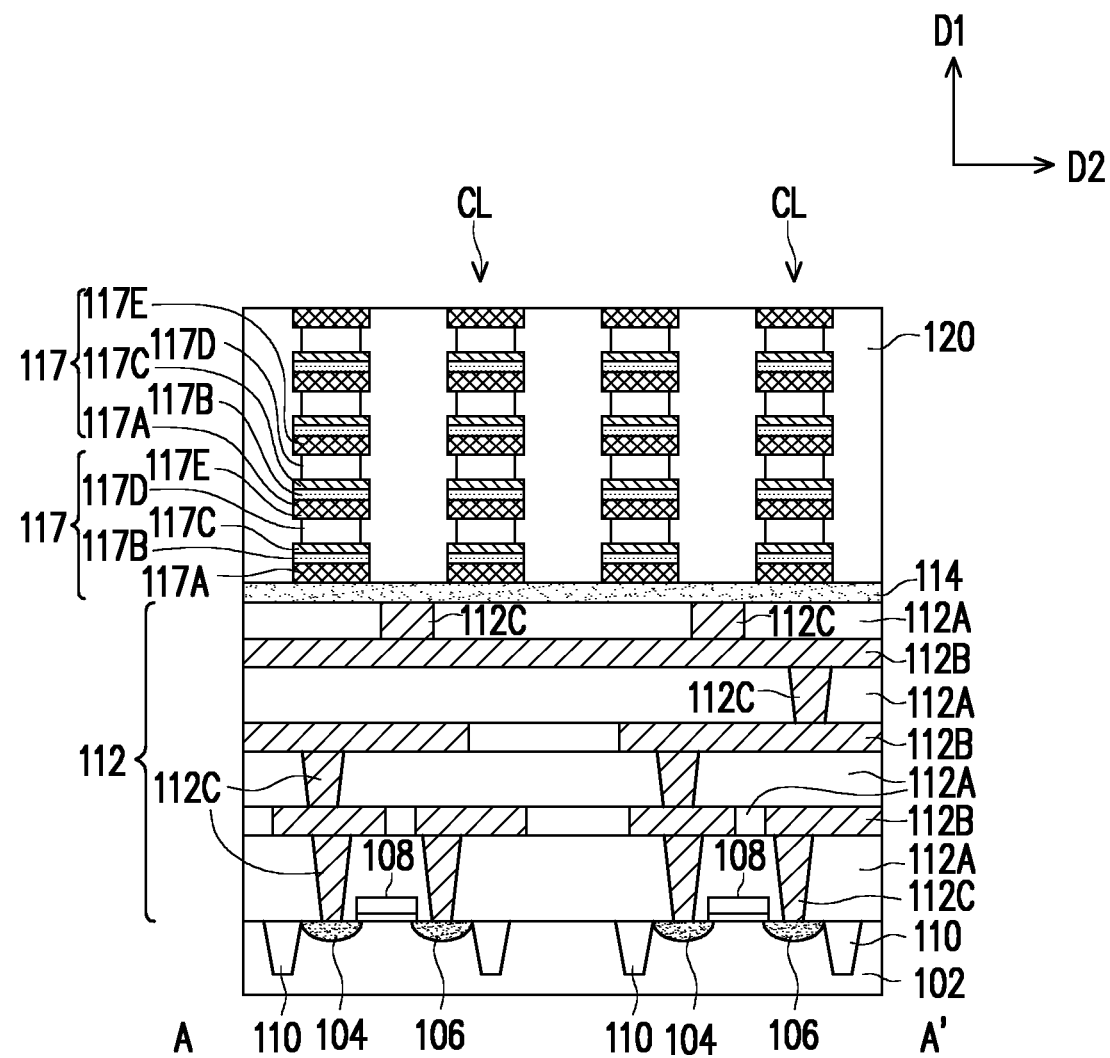

Referring to FIG. 7, in a next step, an isolation material 120 is formed into the plurality of first trenches TR and in the plurality of recesses Rc. For example, the isolation material 120 surrounds the plurality of column structures CL, and surrounds the gate layer 117D. Furthermore, a planarization process, such as a chemical mechanical polish (CMP) process may be performed on the isolation material 120 so that a top surface of the isolation material 120 is coplanar with the topmost dielectric layer (second dielectric layer 117E) of the column structures CL. In some embodiments, the isolation material 120 is an isolation oxide such as silicon oxide, or the like. Furthermore, the isolation material 120 may be formed in the first trenches TR and in the recesses Rc by suitable deposition techniques, such as chemical vapor deposition (CVD), atomic layer deposition (ALD), or the like.

Figure 8:
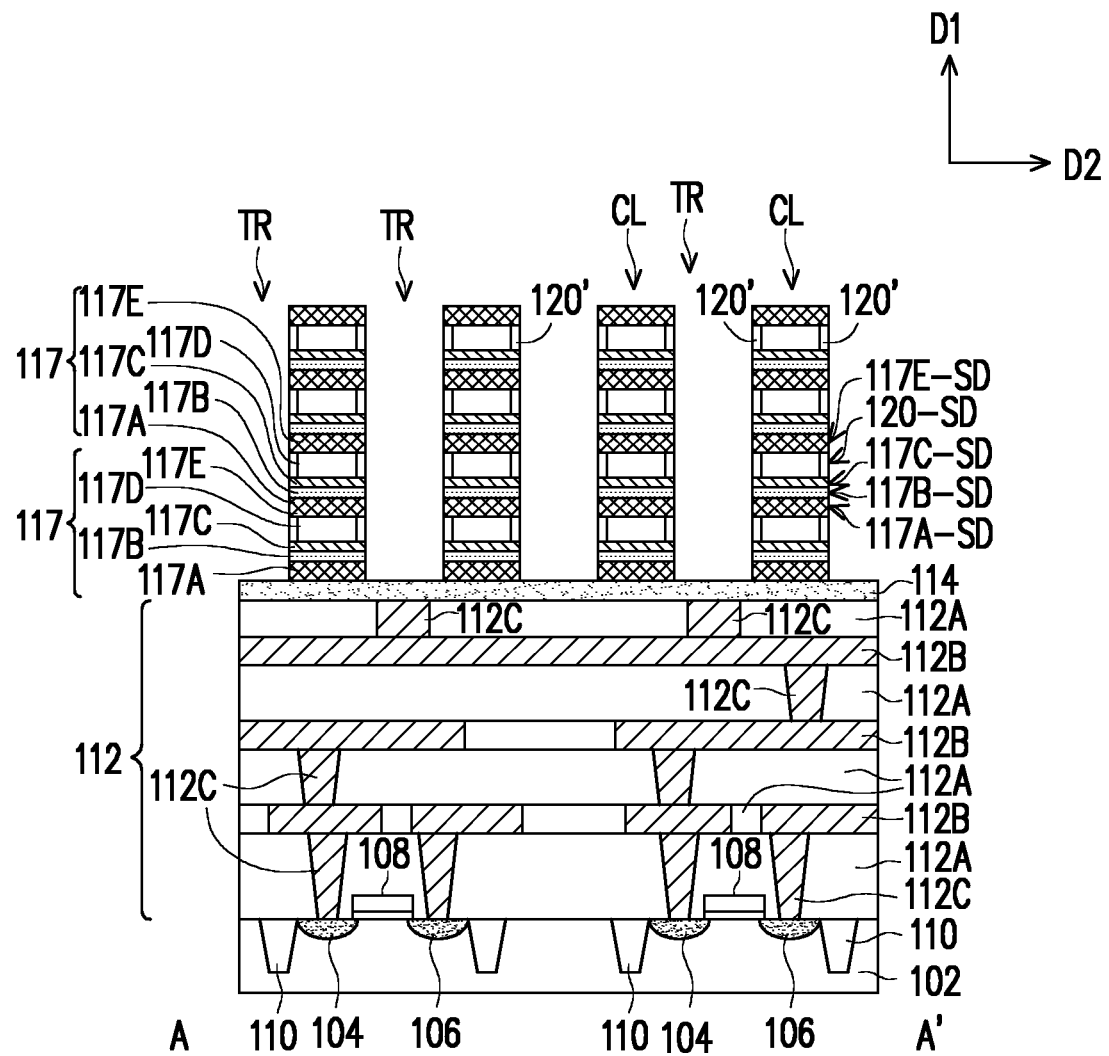

Referring to FIG. 8, the isolation material 120 is patterned by removing portions of the isolation material 120 in the plurality of first trenches TR, whereby the isolation material 120 retained in the plurality of recesses Rc forms an isolation layer 120'. In some embodiments, the isolation material 120 is patterned by an anisotropic etching to form the isolation layer 120'. As illustrated in FIG. 8, after patterning the isolation material 120 to form the isolation layer 120', sidewalls 120-SD of the isolation layer 120' are aligned with sidewalls 117A-SD of the first dielectric layer 117A, sidewalls 117B-SD of the channel layer 117B, sidewalls 117C-SD of the charge trapping layer 117C and sidewalls 117E-SD of the second dielectric layer 117E. In the exemplary embodiment, the isolation layer 120' is formed to surround the gate layer 117D. Furthermore, the isolation layer 120' may be formed as part of the memory stack 117 to surround each of the gate layers 117D, and may be formed as part of each column structure CL.

Figure 9:
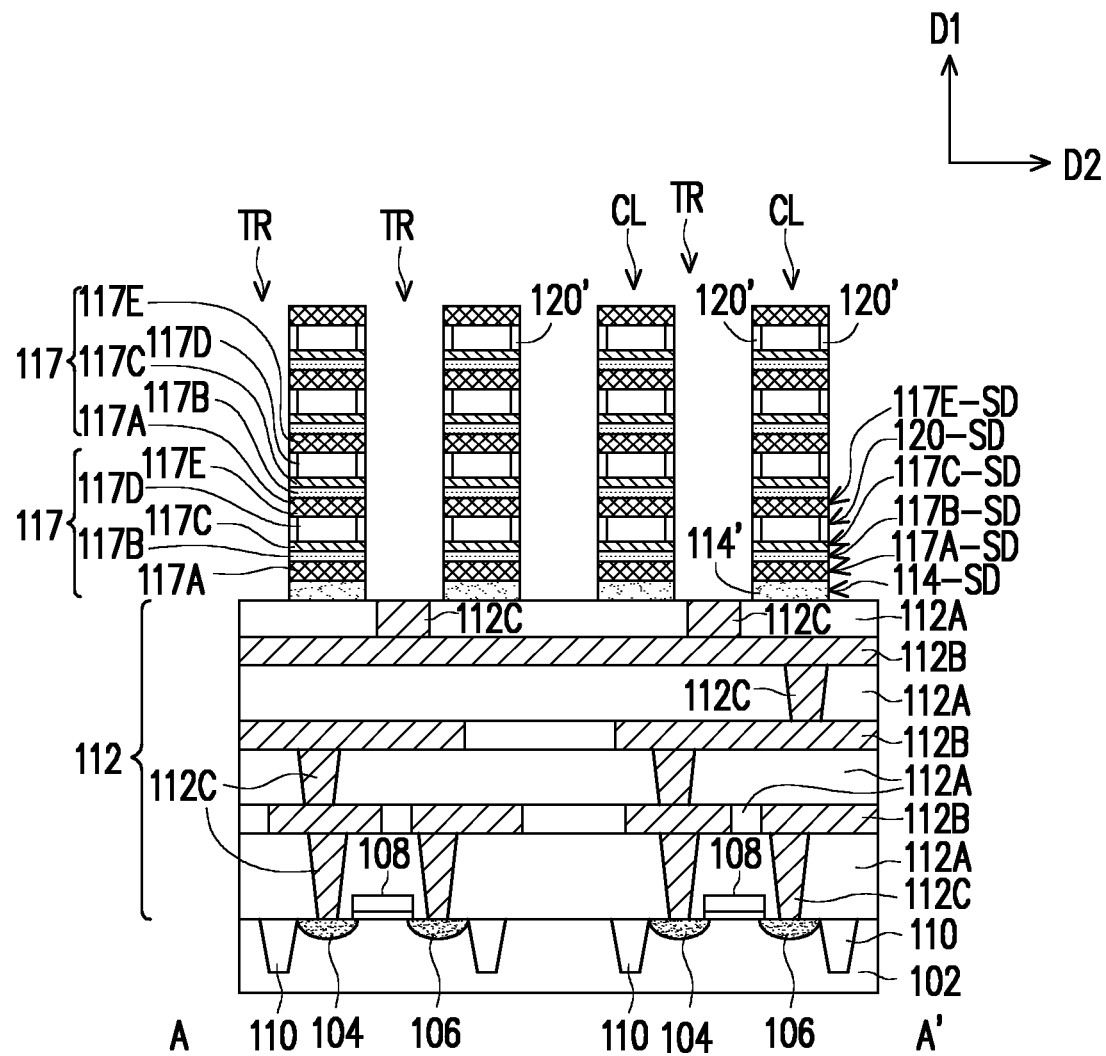

Referring to FIG. 9, in a subsequent step, the etching stop layer 114 is partially removed to form a patterned etching stop layer 114'. In some embodiments, the etching stop layer 114 is partially removed so that the first conductive vias 112C of the first interconnection layer 112 are revealed. After removing portions of the etching stop layer 114, sidewalls 114-SD of the patterned etching stop layer 114' are aligned with the sidewalls 117A-SD of the first dielectric layer 117A, the sidewalls 117B-SD of the channel layer 117B, the sidewalls 117C-SD of the charge trapping layer 117C, the sidewalls 120-SD of the isolation layer 120' and the sidewalls 117E-SD of the second dielectric layer 117E. Furthermore, the patterned etching stop layer 114' may be formed as part of each column structure CL.

Figure 10A:
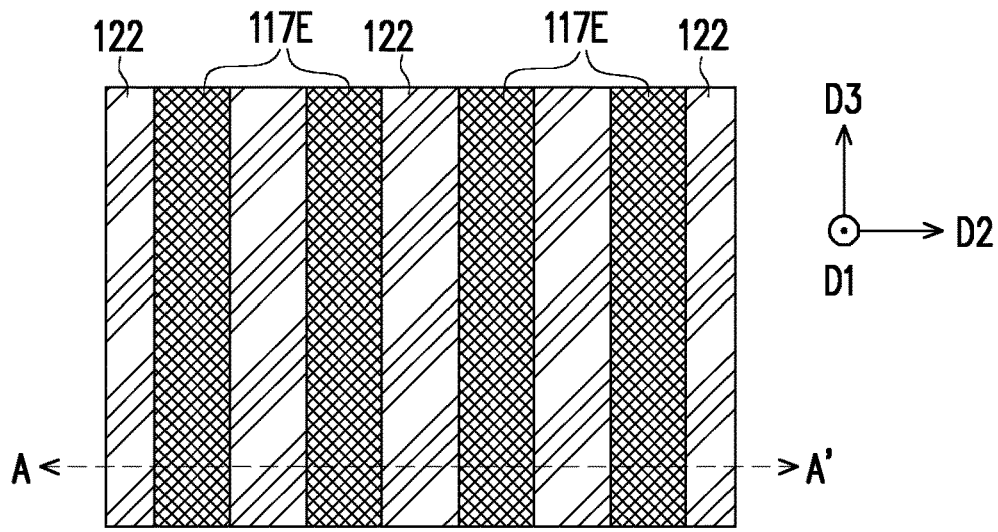
Figure 10B:
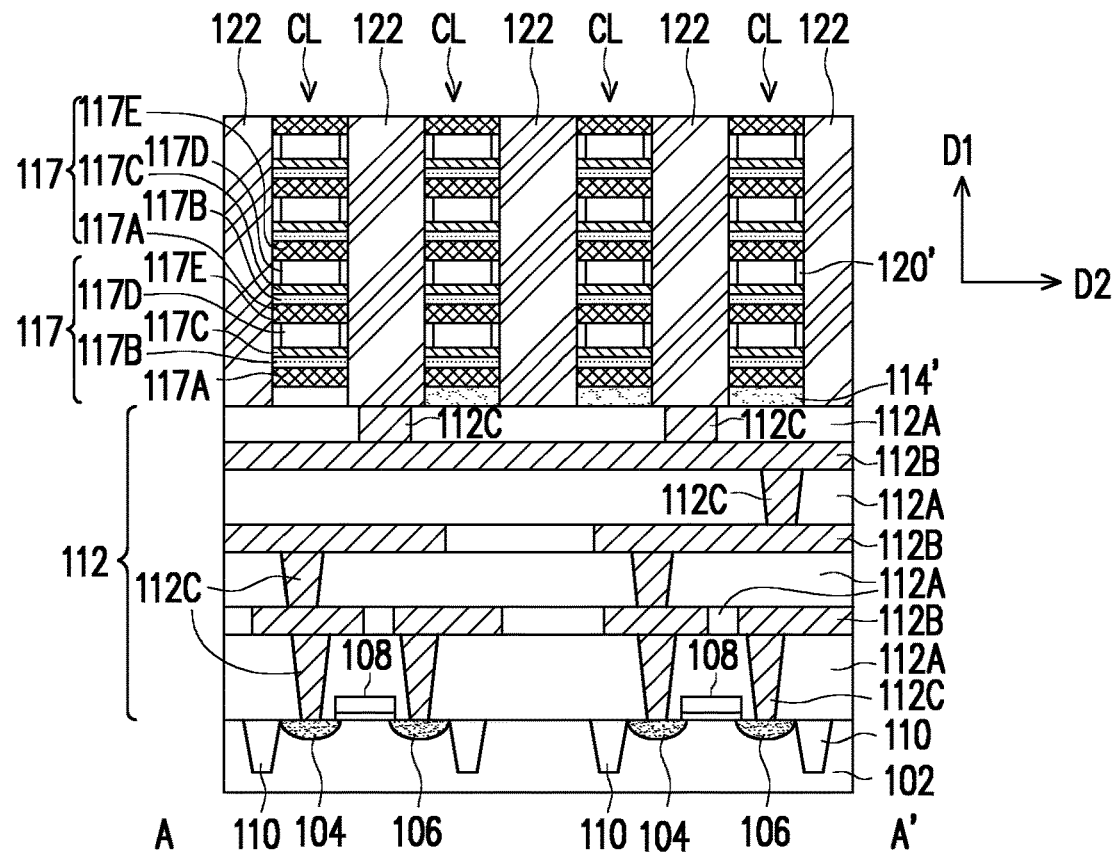

FIG. 10A is a top view of one stage in a method of fabricating a semiconductor device according to some embodiments of the present disclosure. FIG. 10B is a sectional view of the structure shown in FIG. 10A taken along the line A-A'. Referring to FIG. 10A and FIG. 10B, in a subsequent step, a plurality of connecting lines 122 are formed in the first trenches TR aside the memory stacks 117. For example, the connecting lines 122 are formed aside each of the column structures CL to surround the memory stacks 117. The connecting lines 122 may be arranged along the second direction D2 and separated from one another by the column structures CL. Furthermore, the connecting lines 122 may be extending in a third direction D3 (from the top view) that is perpendicular to the second direction D2.

In some embodiments, the connecting lines 122 are made of conductive materials such as Ti, TiN, or the like. In some other embodiments, the connecting lines 122 are made of doped polysilicon. For example, in one embodiment, when the channel layer 117B is made of polysilicon, then the connecting lines 122 may be $N^+$ polysilicon. In another embodiment, when the channel layer 117B is made of oxide semiconductors, such as InGaZnO or InZnO, then the connecting lines 122 may be conductive materials such as Ti or TiN. In certain embodiments, the connecting lines 122 may be formed to extend over a top surface of the column structures CL. Thereafter, a planarization process, such as a chemical mechanical polish (CMP) process and/or etching back process or combinations thereof, may be performed to remove a portion of the connecting lines 122 so that a top surface of the connecting lines 122 is coplanar with the top surface of the column structures CL.

Figure 11A:
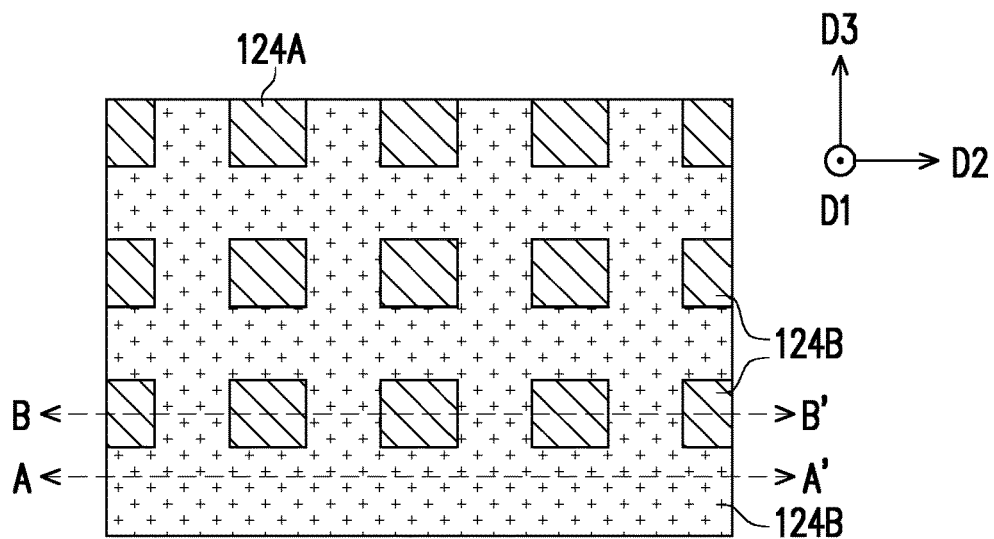
Figure 11B:
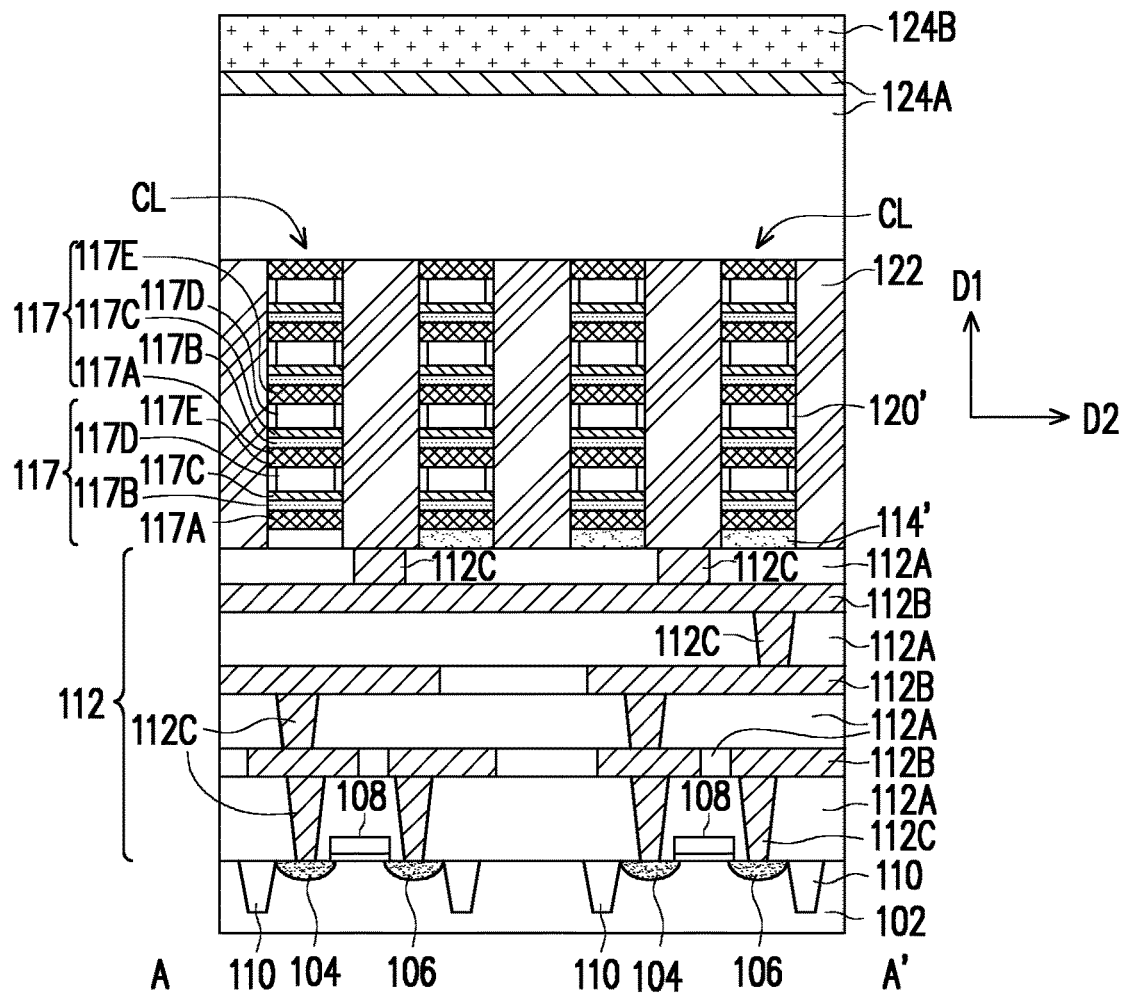
Figure 11C:
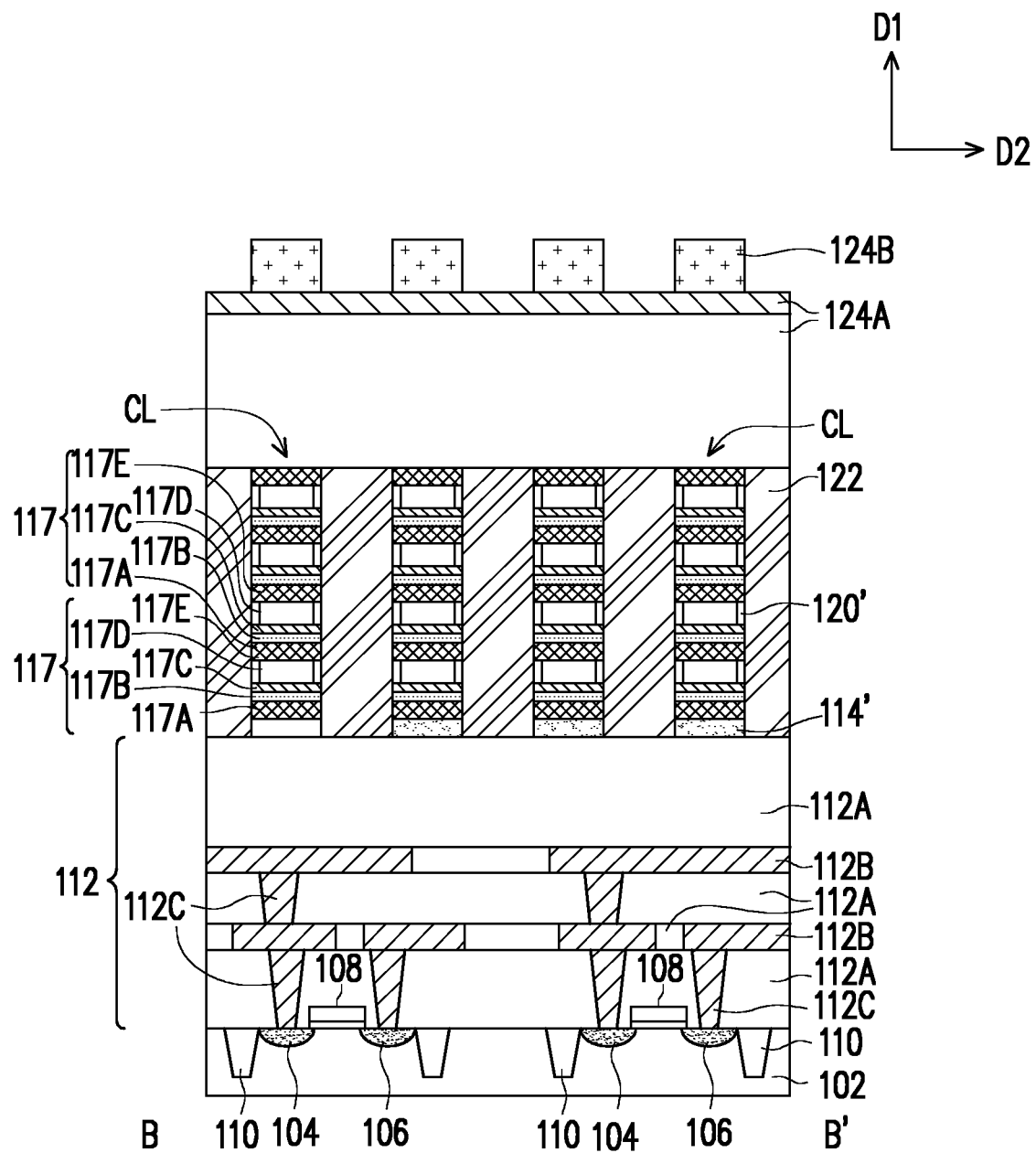

FIG. 11A is a top view of one stage in a method of fabricating a semiconductor device according to some embodiments of the present disclosure. FIG. 11B is a sectional view of the structure shown in FIG. 11A taken along the line A-A'. FIG. 11C is a sectional view of the structure shown in FIG. 11A taken along the line B-B'. Referring to FIG. 11A to FIG. 11C, after forming the connecting lines 122, mask layers 124A and a patterned photoresist layer 124B are formed over the connecting lines 122 and over the column structures CL. In some embodiments, the mask layers 124A are silicon nitride layers, or silicon oxide layers formed, for example, by low-pressure chemical vapor deposition (LPCVD) or plasma enhanced chemical vapor deposition (PECVD). The mask layers 124A are used as a hard mask during subsequent photolithography processes. In certain embodiments, the patterned photoresist layer 124B having a predetermined pattern is formed on the mask layers 124A. The mask layers 124A and the patterned photoresist layer 124B are used for patterning the connecting lines 122 while protecting the column structures CL.

Figure 12A:
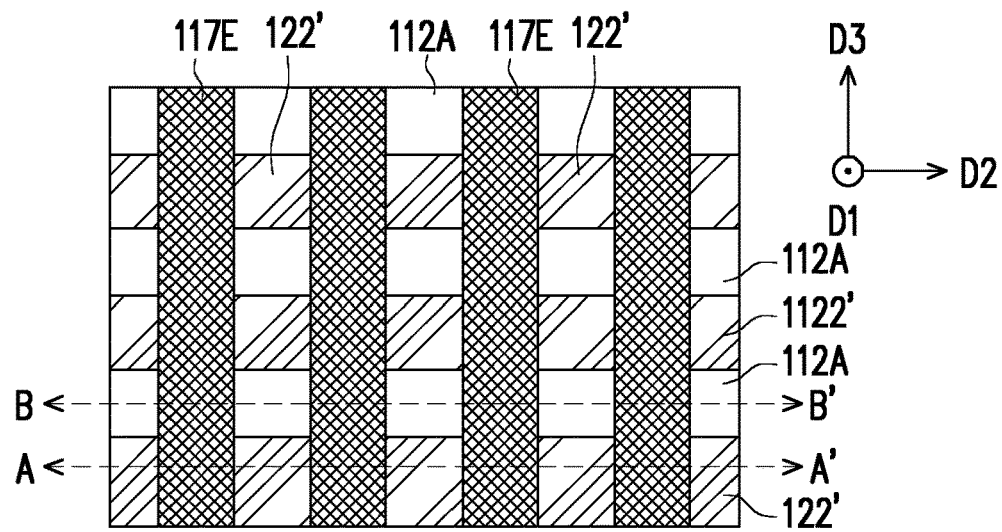
Figure 12B:
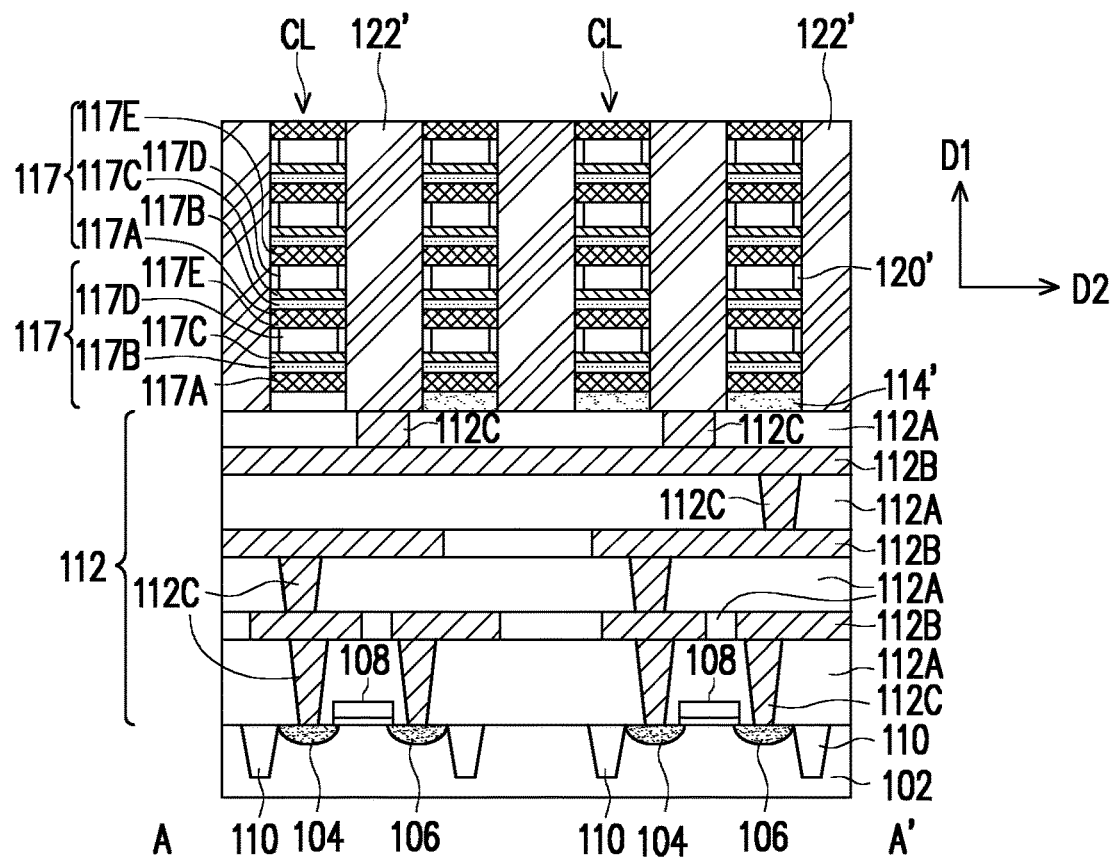
Figure 12C:
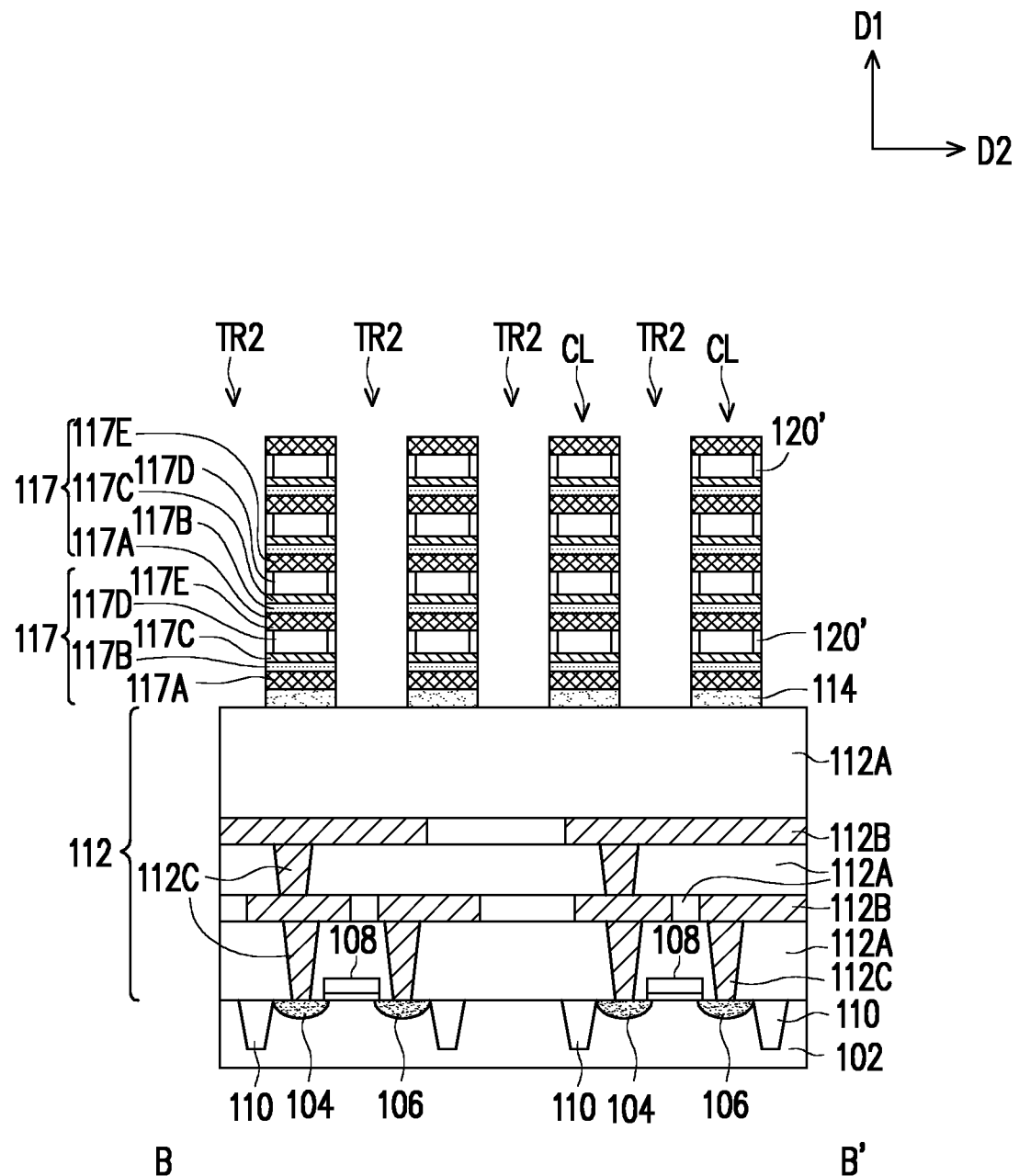

FIG. 12A is a top view of one stage in a method of fabricating a semiconductor device according to some embodiments of the present disclosure. FIG. 12B is a sectional view of the structure shown in FIG. 12A taken along the line A-A'. FIG. 12C is a sectional view of the structure shown in FIG. 12A taken along the line B-B'. Referring to FIG. 12A to FIG. 12C, the connecting lines 122 are patterned to form a plurality of second trenches TR2 that separate the patterned connecting lines 122' and separate the column structures CL from one another. For example, the connecting lines 122 are patterned by removing portions of the connecting lines 122 not covered by the patterned photoresist layer 124B to form the second trenches TR2. In some embodiments, the second trenches TR2 reveal the first inter-metal dielectric layers 112A of the first interconnection layer 112. Furthermore, the patterned connecting lines 122' are used as source lines and bit lines in the memory cell.

Figure 13A:
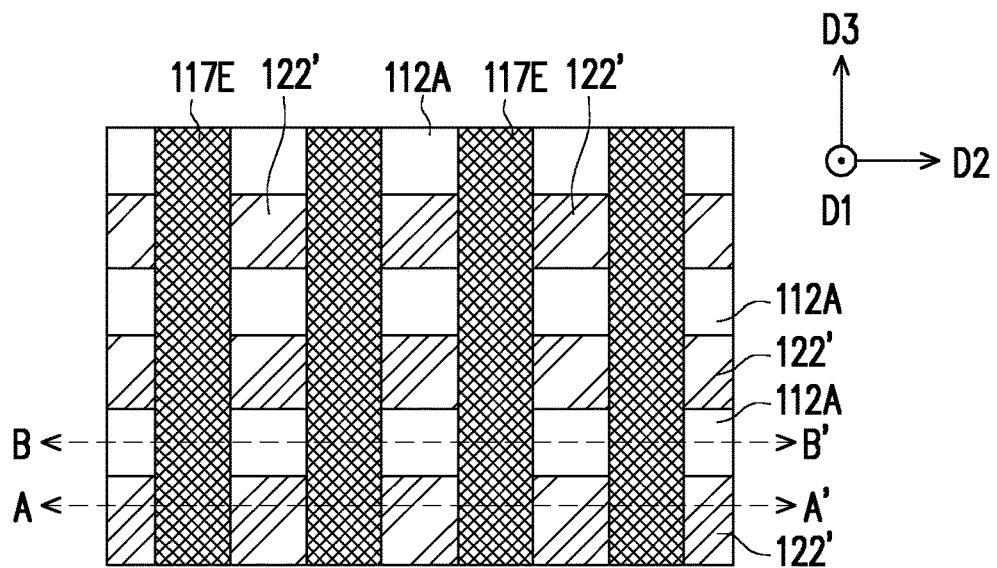
Figure 13B:
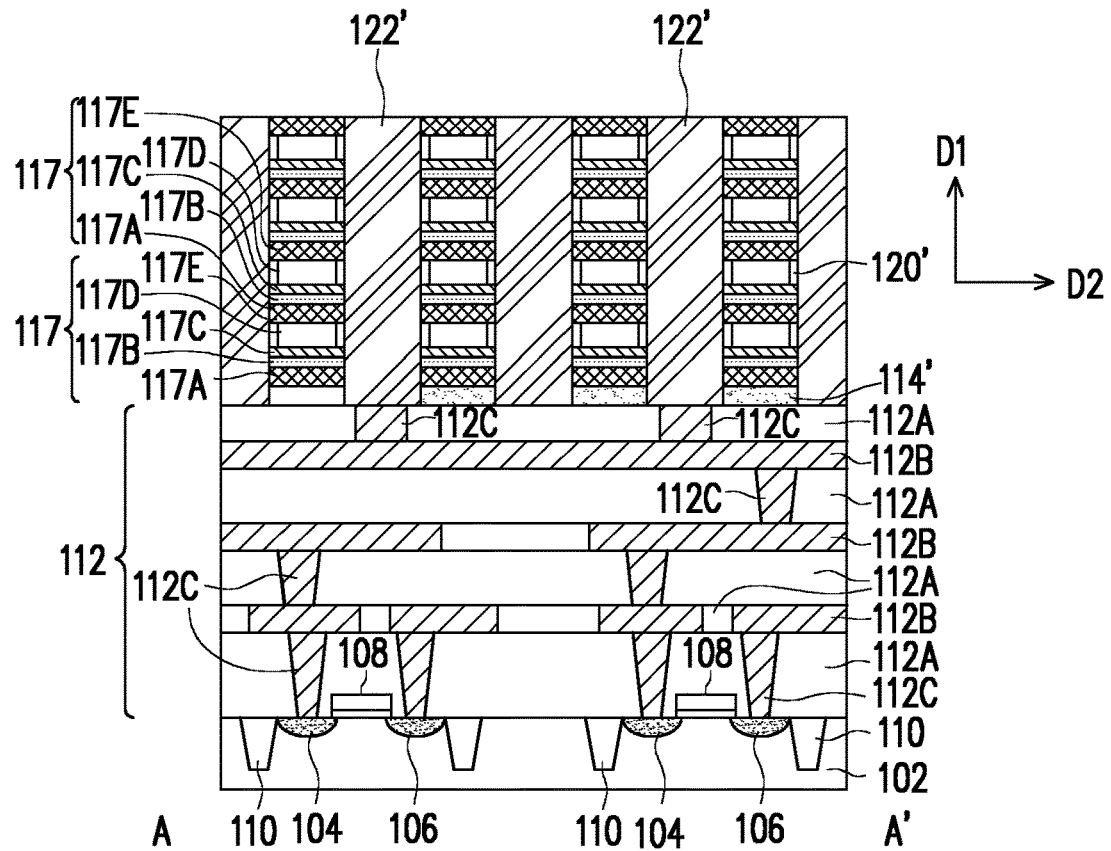
Figure 13C:
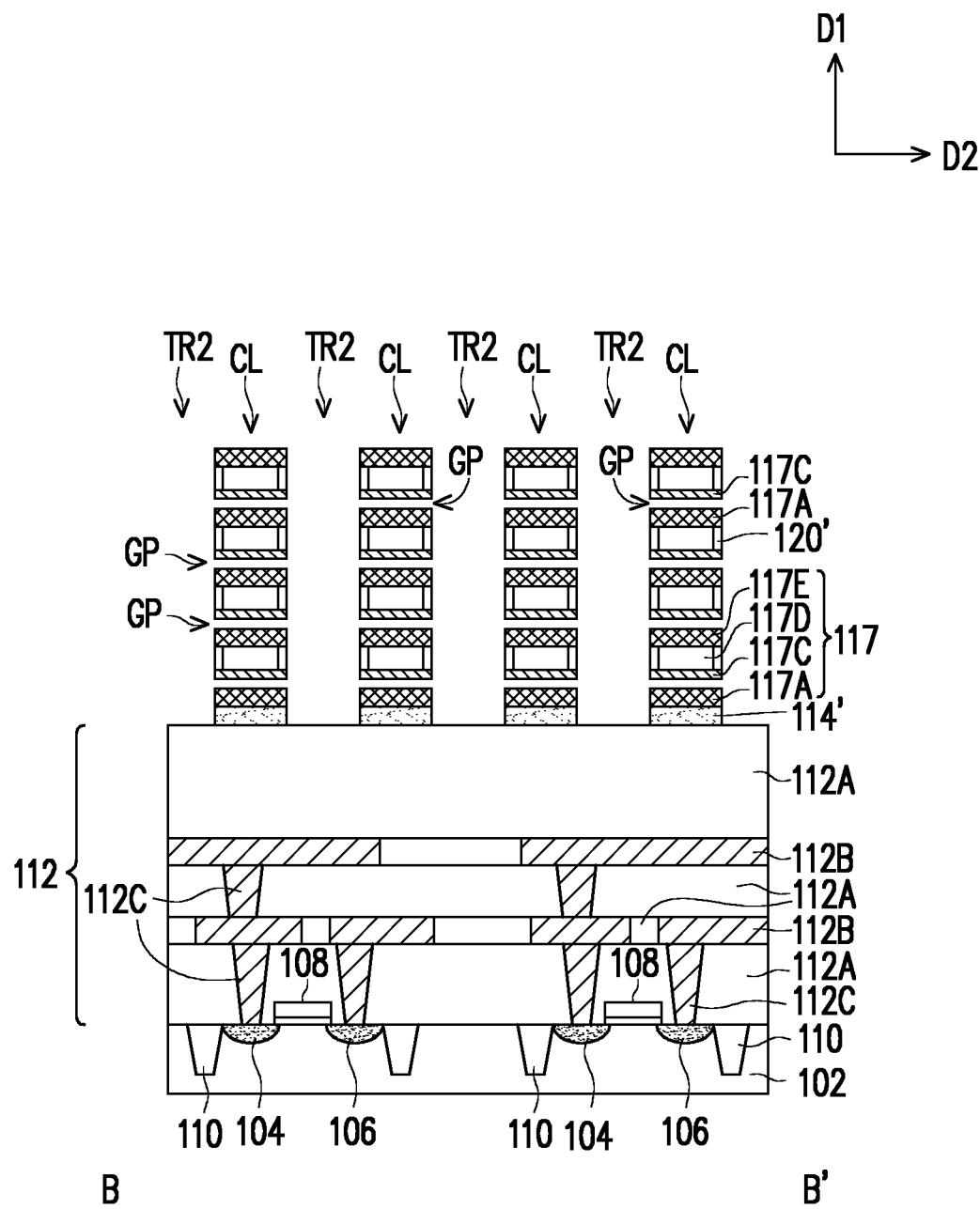

FIG. 13A is a top view of one stage in a method of fabricating a semiconductor device according to some embodiments of the present disclosure. FIG. 13B is a sectional view of the structure shown in FIG. 13A taken along the line A-A'. FIG. 13C is a sectional view of the structure shown in FIG. 13A taken along the line B-B'. Referring to FIG. 13A to FIG. 13C, after patterning the connecting lines 122 to form the second trenches TR2, lateral etching is performed to remove portions of the channel layer 117B in each of the plurality of memory stacks 117. For example, isotropic etching is performed to laterally remove portions of the channel layer 117B. In some embodiments, wet etching or dry etching is performed depending on a material of the channel layer 117B. In some embodiments, a gap GP is formed in each of the memory stacks 117 between the charge trapping layer 117C and the first dielectric layer 117A after the lateral etching process (see FIG. 13C).

Figure 14A:
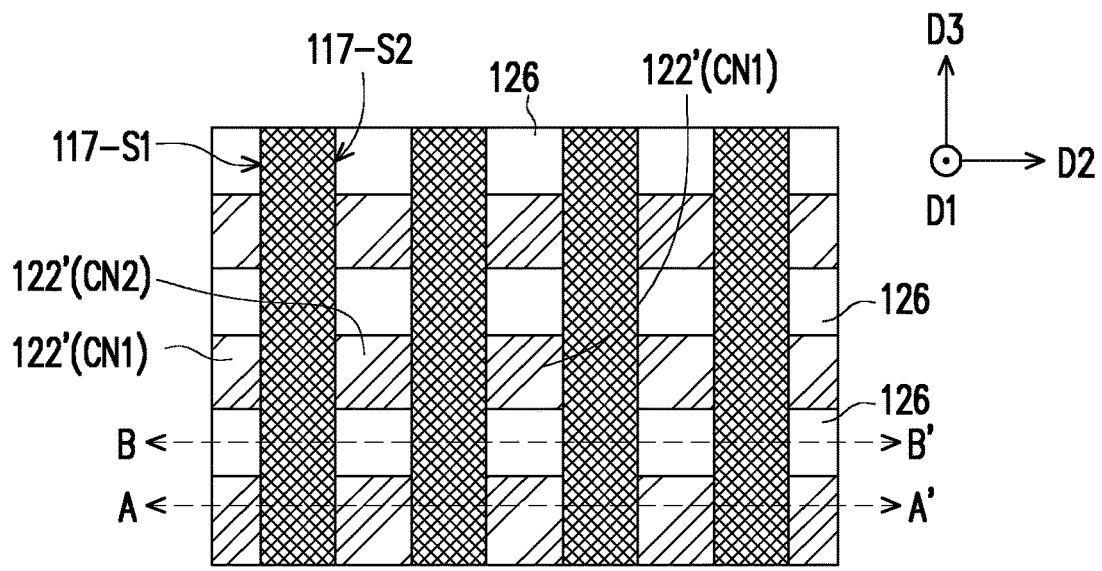
Figure 14B:
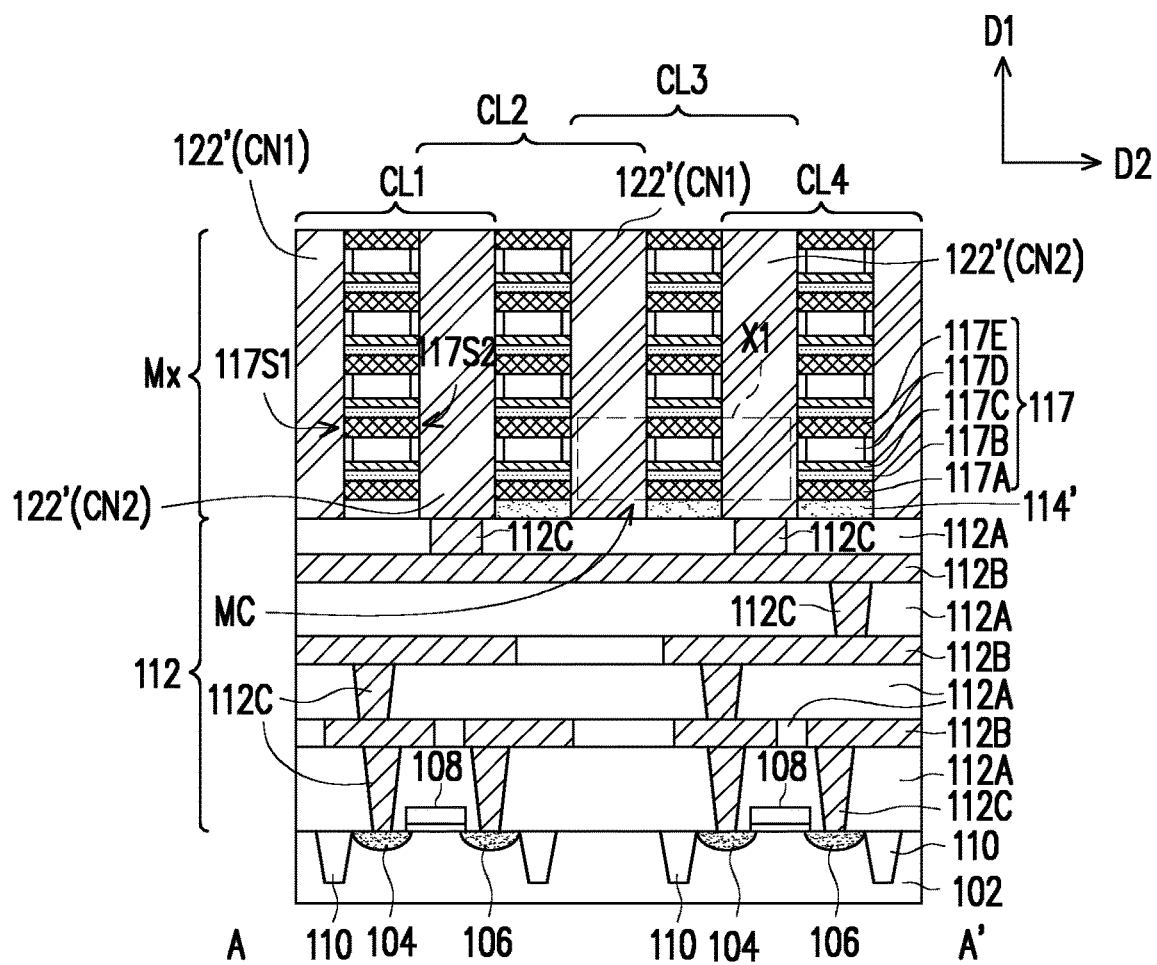
Figure 14C:
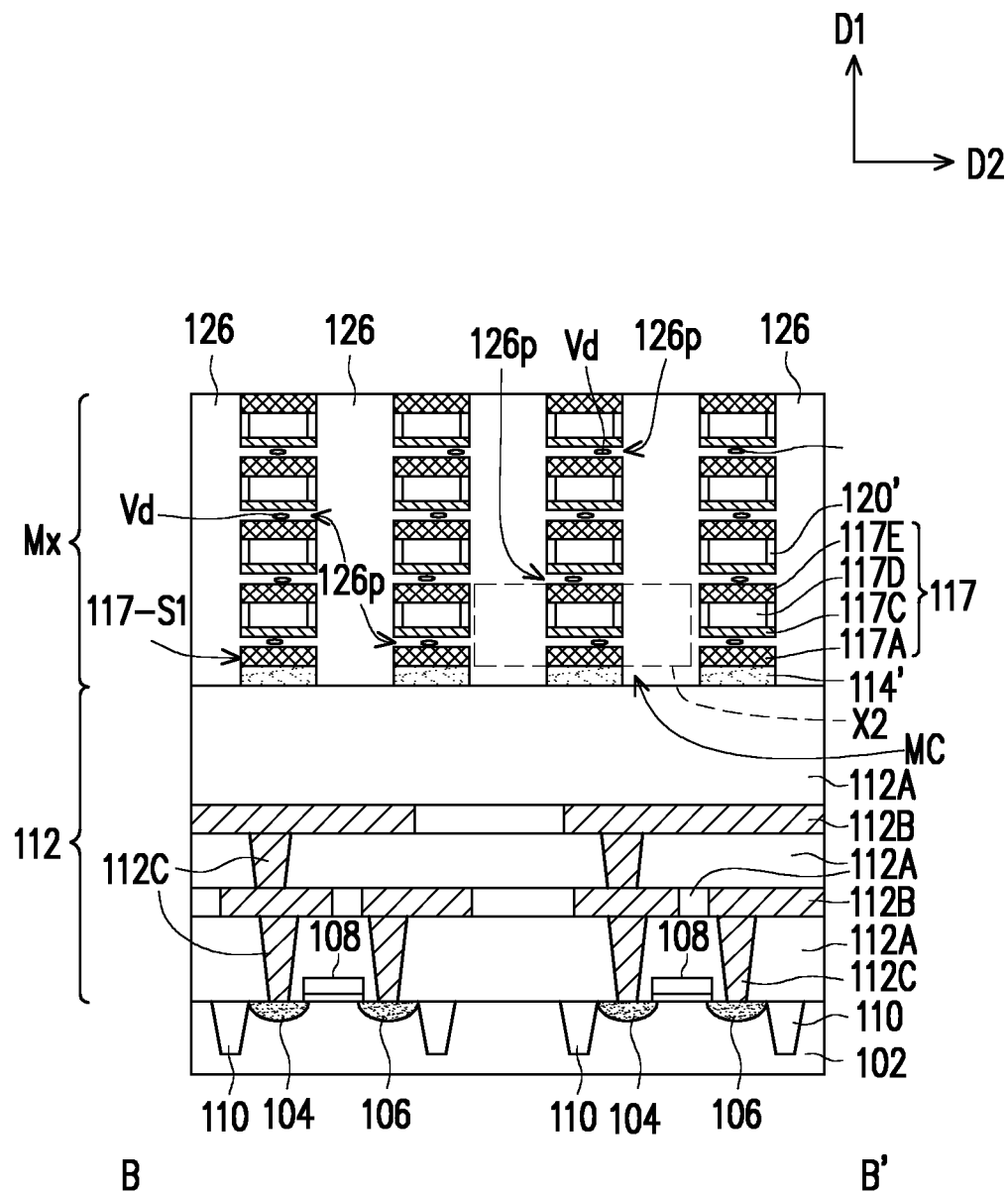

FIG. 14A is a top view of one stage in a method of fabricating a semiconductor device according to some embodiments of the present disclosure. FIG. 14B is a sectional view of the structure shown in FIG. 14A taken along the line A-A'. FIG. 14C is a sectional view of the structure shown in FIG. 14A taken along the line B-B'. Referring to FIG. 14A to FIG. 14C, after forming the gap GP in each of the memory stacks 117, a plurality of insulating layers 126 are formed in the plurality of second trenches TR2 aside the connecting lines 122' and aside the memory stacks 117. For example, the insulating layers 126 fill into the gap GP between the charge trapping layer 117C and the first dielectric layer 117A to form gap filling portions 126P. In some embodiments, during the formation of the insulating layers 126, voids Vd will be formed in the gap filling portions 126P. In certain embodiments, the voids Vd existing inside the memory stacks 117 are allowed as air gaps, which will improve the performance of the device. For example, in one embodiment, as the air gap has minimal dielectric constant (k=1) as compared with $SiO_2$ (k=3.9), the air gaps between the memory cells will help in the reduction of resistive-capacitive (RC) delay time. In some embodiments, the insulating layers 126 are insulating materials such as silicon oxide, silicon nitride, polymers, or combinations thereof. Furthermore, the insulating layers 126 may be formed by suitable deposition techniques, such as chemical vapor deposition (CVD), atomic layer deposition (ALD), or the like, and further planarized through chemical mechanical polish (CMP) processes, or the like.

After forming the insulating layers 126, a memory array Mx according to some embodiments of the present disclosure is formed. As illustrated in FIG. 14A to FIG. 14C, the memory array Mx includes four columns of stacked memory cells MC. For example, a first column CL1 of memory cells MC, a second column CL2 of memory cells MC, a third column CL3 of memory cells MC and a fourth column CL4 of memory cells MC are arranged side by side. Although four columns of stacked memory cells MC are illustrated herein, it should be noted that the disclosure is not limited thereto. For example, the number of columns of stacked memory cells MC may be adjusted based on product requirement. As shown in FIG. 14A to FIG. 14C, the memory cells MC are stacked up along the first direction D1 to form the columns (CL1, CL2, CL3, CL4) of stacked memory cells MC having column structures. Furthermore, each of the columns (CL1, CL2, CL3, CL4) of stacked memory cells MC are arranged along the second direction D2. The details of each of the memory cells MC may be referred to the enlarged sectional views shown in FIG. 15A and FIG. 15B.

Figure 15A:
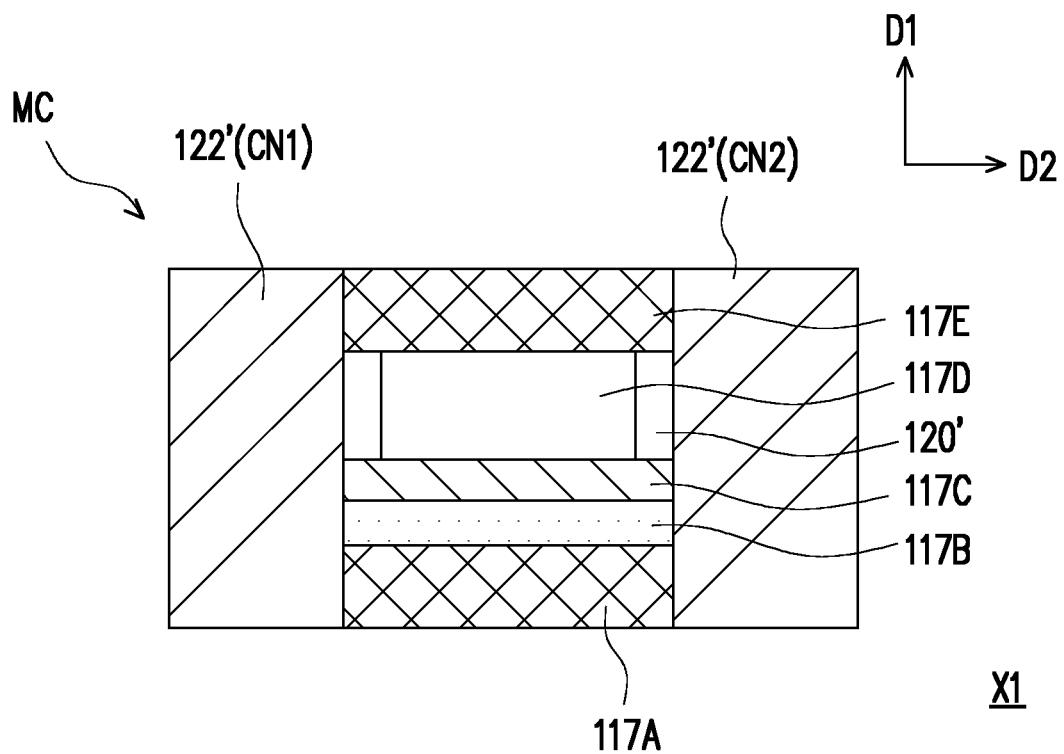
Figure 15B:
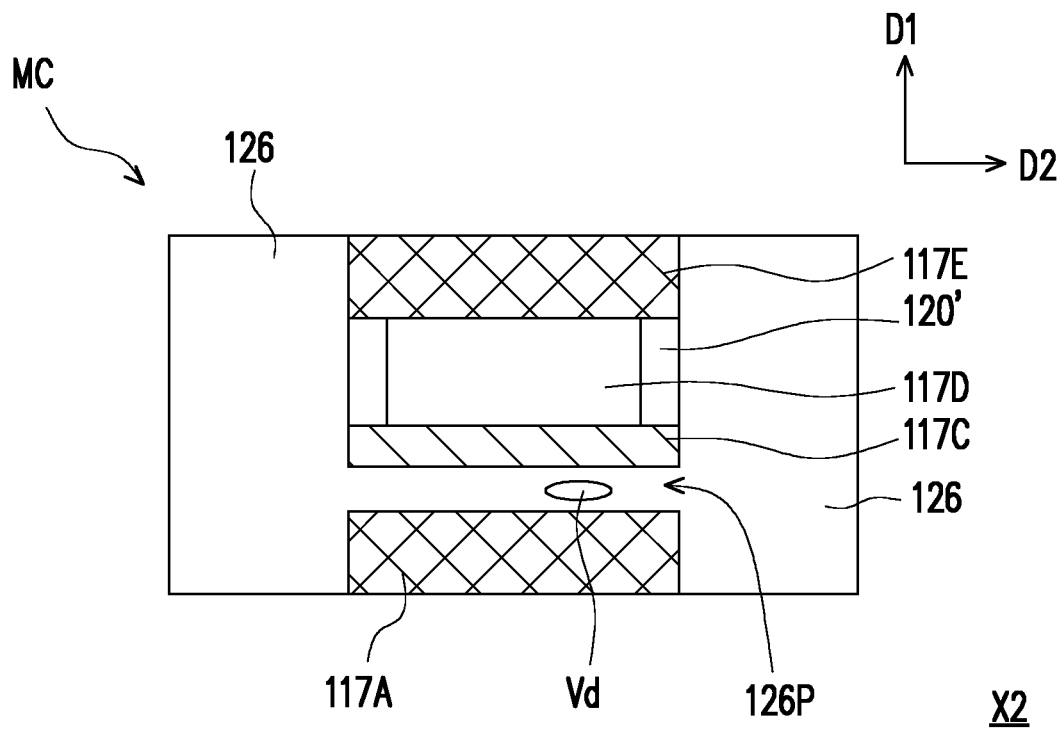

FIG. 15A is an enlarged view of section X1 in FIG. 14B showing one memory cell MC. FIG. 15B is an enlarged view of section X2 in FIG. 14C shown the same memory cell MC. Referring to FIG. 14A to FIG. 15B, each of the memory cells MC may include a memory stack 117, a first connecting line CN1 (part of the connecting lines 122'), a second connecting line CN2 (part of the connecting lines 122') and insulating layers 126. In some embodiments, the connecting lines 122' (CN1, CN2) are extending along the first direction D1 and covering side surfaces of the memory stack 117. The memory stack 117 includes the first dielectric layer 117A, the channel layer 117B, the charge trapping layer 117C, the gate layer 117D and the second dielectric layer 117E stacked up in sequence along the first direction D1. The first connecting line CN1 is located on a first side surface 117-S1 of the memory stack 117. The second connecting line CN2 is located on a second side surface 117-S2 of the memory stack 117 opposite to the first side surface 117-S1. The isolation layer 120' is surrounding the gate layer 117D, and separating the gate layer 117D from the first connecting line CN1 and the second connecting line CN2. Furthermore, the second connecting line CN2 may be connected to the first interconnection layer 112.

In some embodiments, the insulating layers 126 are extending along the first direction D1, and covering side surfaces of the memory stack 117. For example, the insulating layers 126 are covering the first side surface 117-S1 and the second side surface 117-S2 of the memory stack 117. The insulating layers 126 includes the gap filling portions 126P located in between the first dielectric layer 117A and the charge trapping layer 117C, whereby voids Vd exist in the gap filling portions 126P. Although one void Vd is shown in each of the memory cells MC, it should be noted that the disclosure is not limited thereto. In some embodiments, some of the memory cells MC may include no voids Vd, while some other memory cells Mc may include more than one voids Vd in the memory stack 117.

In some embodiments, the second dielectric layer 117E of one of the plurality of memory cells MC corresponds to the first dielectric layer 117A of another one of the plurality of memory cells MC stacked above. In other words, the first dielectric layer 117A and/or the second dielectric layer 117E may be shared between the memory cells MC. Furthermore, at least one of the first connecting line CN1 or the second connecting line CN2 is shared between the columns (CL1, CL2, CL3, CL4) of stacked memory cells MC. For example, the second connecting line CN2 of one of the memory cells MC in the first column CL1 corresponds to the second connecting line CN2 of one of the memory cells MC in the second column CL2 (so the second connecting line CN2 is shared therebetween). Similarly, the first connecting line CN1 of one of the memory cells MC in the second column CL2 corresponds to the first connecting line CN1 of one of the memory cells MC in the third column CL3 (so the first connecting line CN1 is shared therebetween).

Figure 16A:
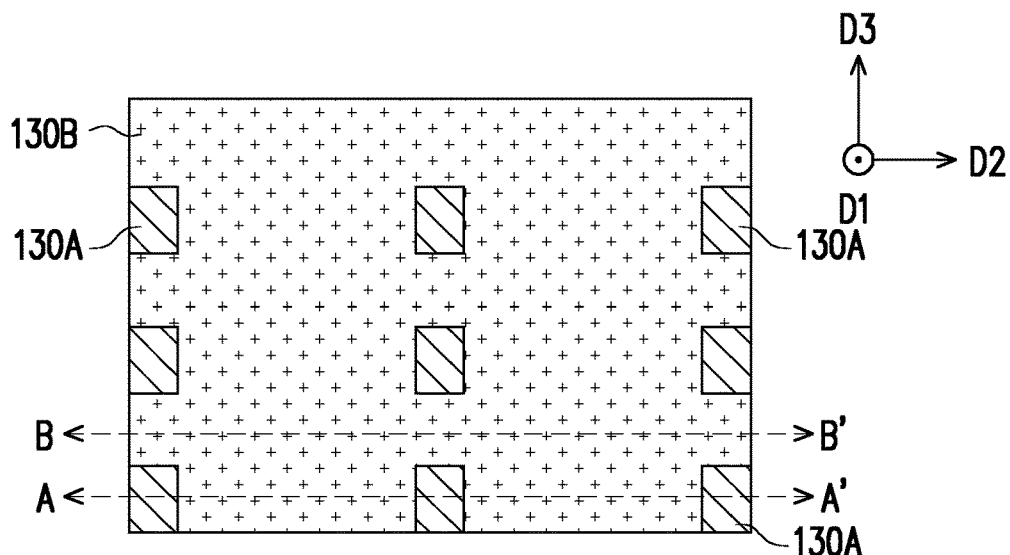
Figure 16B:
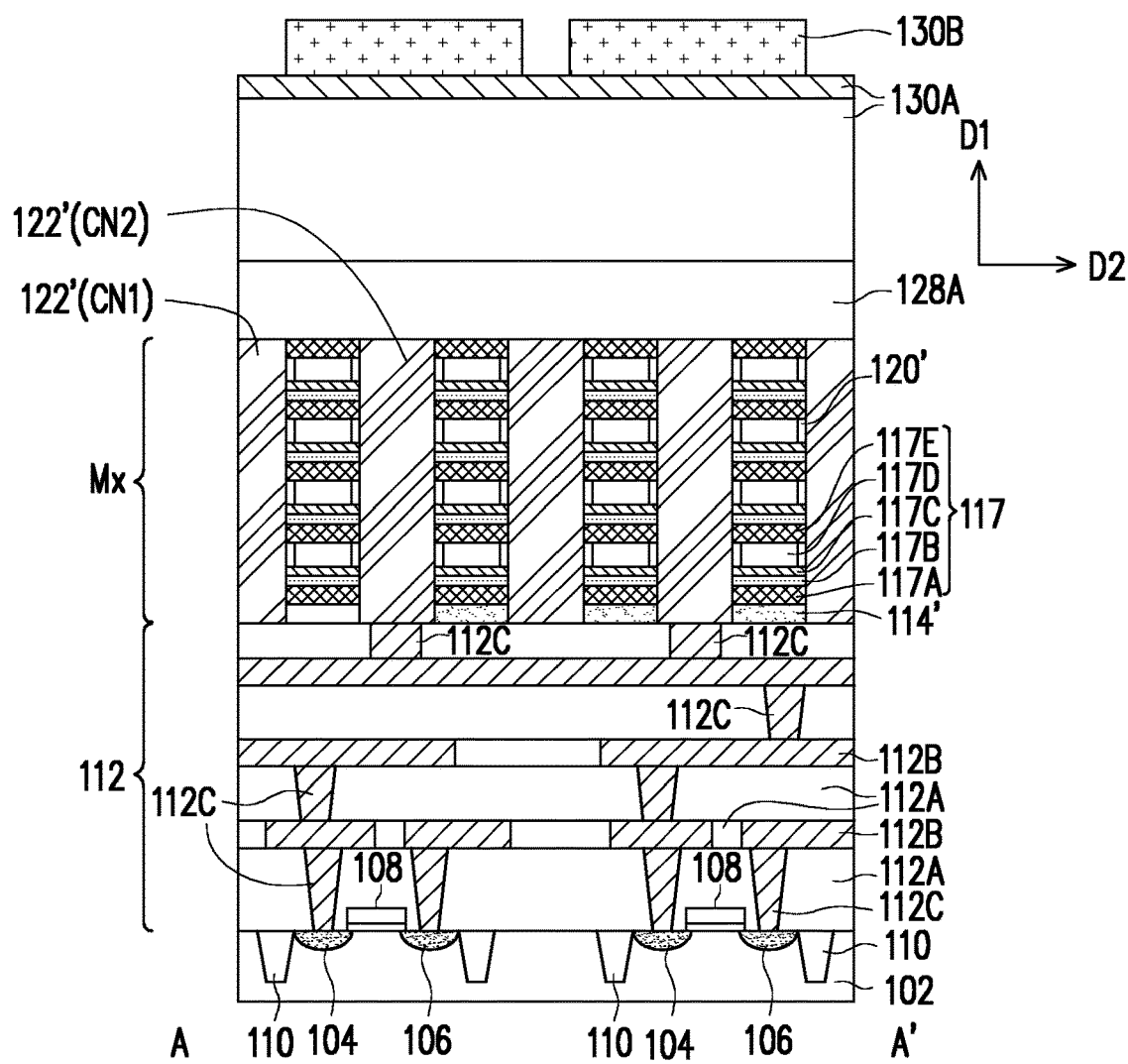
Figure 16C:
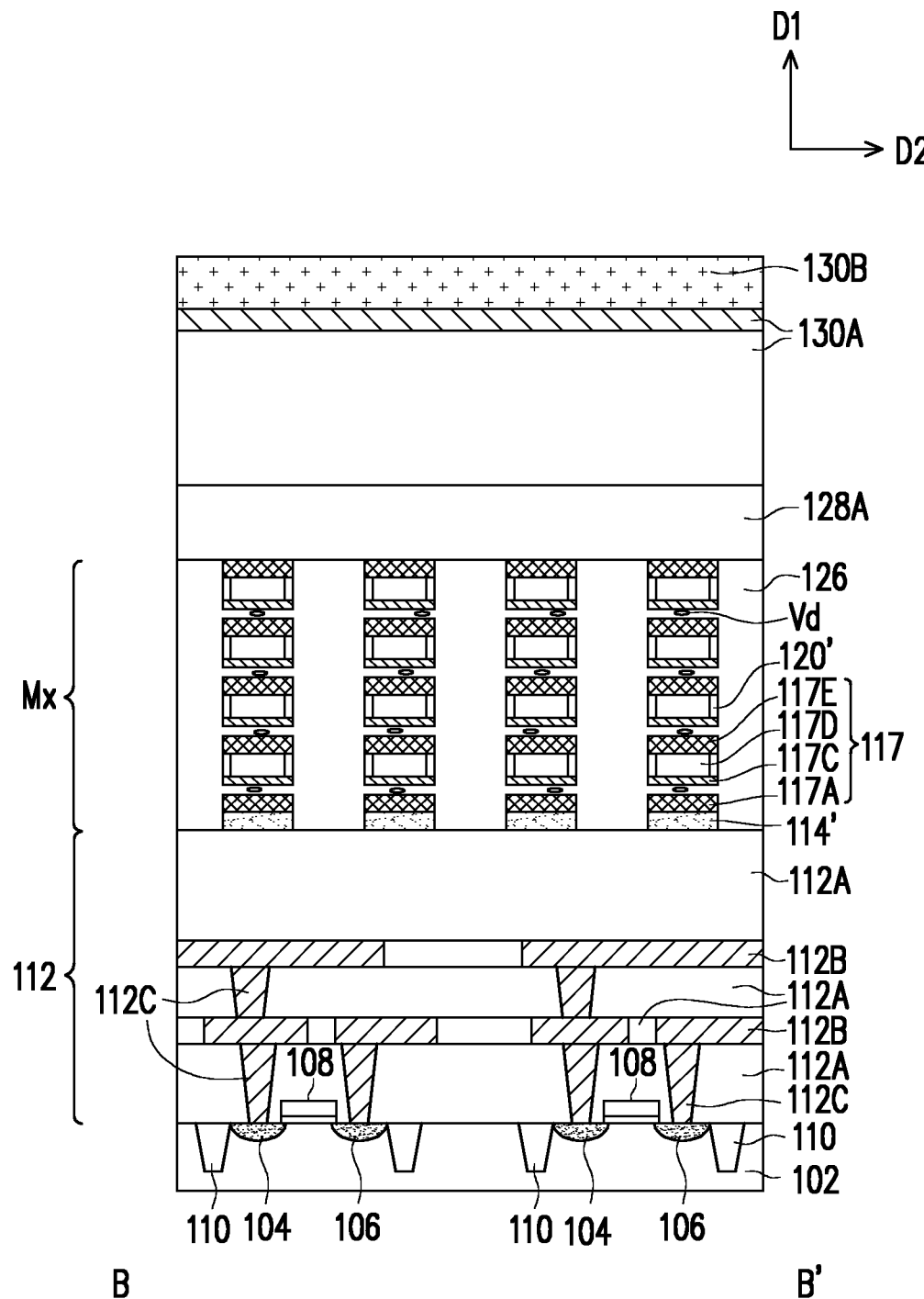

FIG. 16A is a top view of one stage in a method of fabricating a semiconductor device according to some embodiments of the present disclosure. FIG. 16B is a sectional view of the structure shown in FIG. 16A taken along the line A-A'. FIG. 16C is a sectional view of the structure shown in FIG. 16A taken along the line B-B'. Referring to FIG. 16A to FIG. 16C, after forming the memory array Mx, a second inter-metal dielectric layer 128A, mask layers 130A and a patterned photoresist layer 130B are sequentially formed over the memory array Mx. The second inter-metal dielectric layer 128A is made of a dielectric material, such as silicon oxide, silicon nitride, silicon oxynitride, a spill-on dielectric material, or a low-k dielectric material, which may be patterned using a photolithography and/or etching process. Furthermore, the second inter-metal dielectric layer 128A is formed by suitable fabrication techniques such as spin-on coating, chemical vapor deposition (CVD), plasma-enhanced chemical vapor deposition (PECVD) or the like. The disclosure is not limited thereto. In some embodiments, the mask layers 130A are silicon nitride layers, or silicon oxide layers formed, for example, by low-pressure chemical vapor deposition (LPCVD) or plasma enhanced chemical vapor deposition (PECVD). The mask layers 130A are used as a hard mask during subsequent photolithography processes. In certain embodiments, the patterned photoresist layer 130B having a predetermined pattern is formed on the mask layers 130A.

Figure 17A:
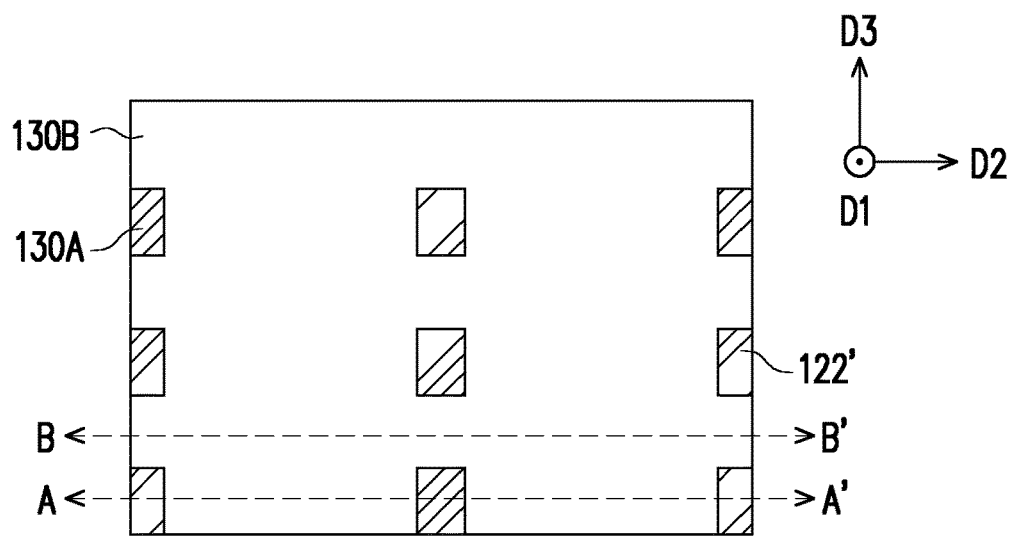
Figure 17B:
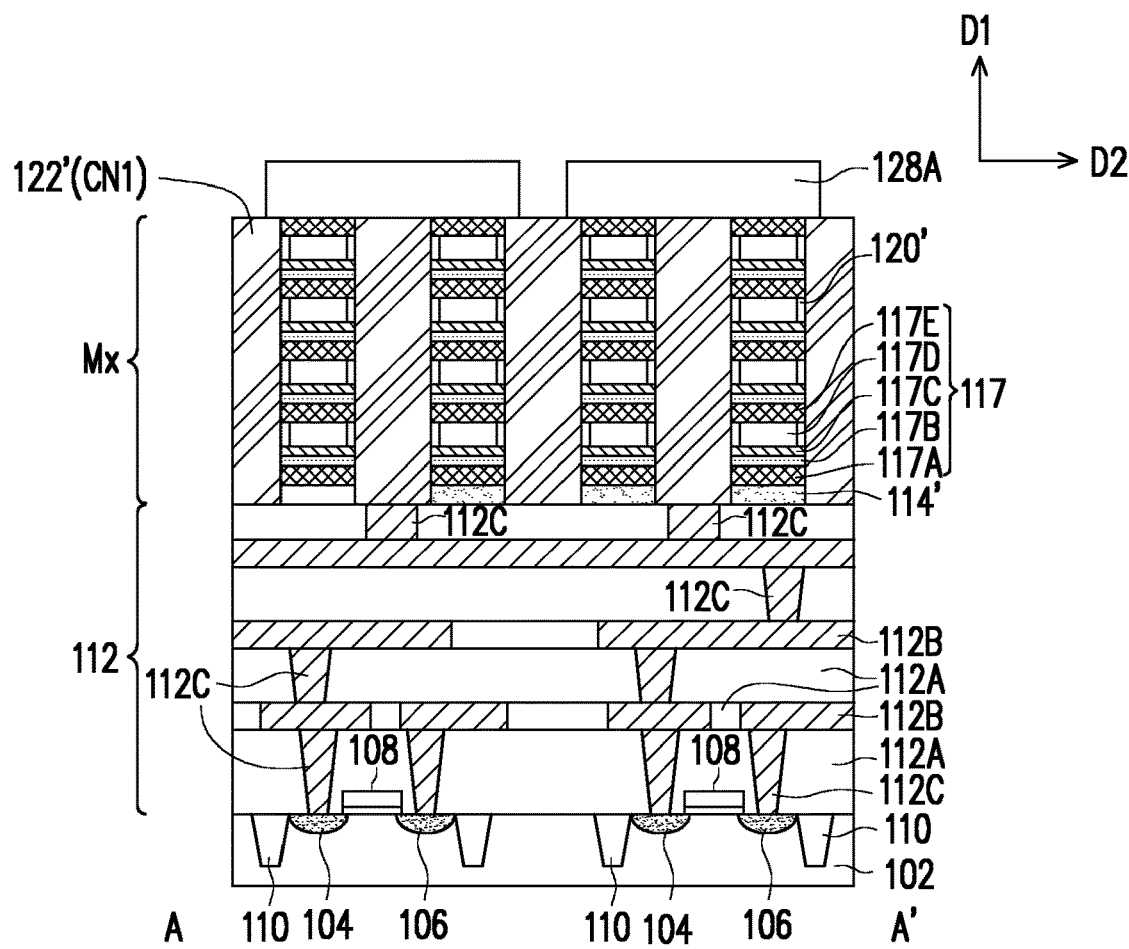
Figure 17C:
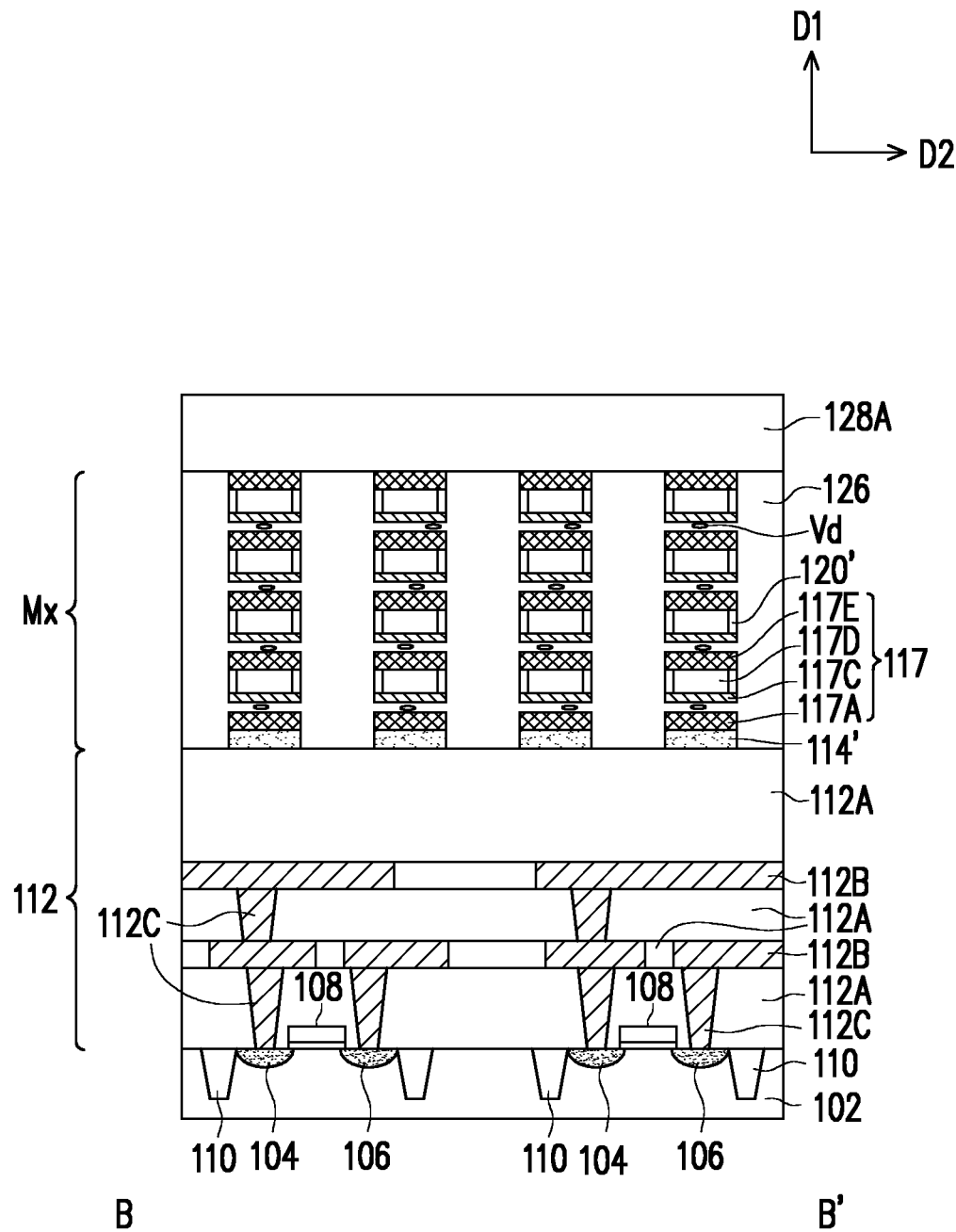

FIG. 17A is a top view of one stage in a method of fabricating a semiconductor device according to some embodiments of the present disclosure. FIG. 17B is a sectional view of the structure shown in FIG. 17A taken along the line A-A'. FIG. 17C is a sectional view of the structure shown in FIG. 17A taken along the line B-B'. Referring to FIG. 17A to FIG. 17C, the second inter-metal dielectric layer 128A is patterned to form openings that reveal the patterned connecting lines 122' (first connecting line CL1). For example, portions of the second inter-metal dielectric layer 128A not covered by the patterned photoresist layer 130B are etched to expose the patterned connecting lines 122' (first connecting line CL1).

Figure 18A:
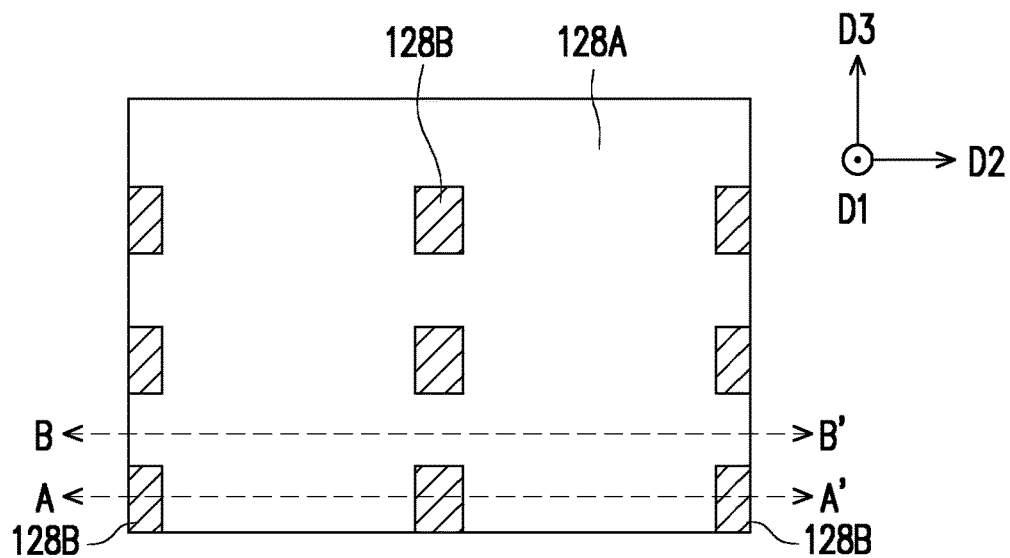
Figure 18B:
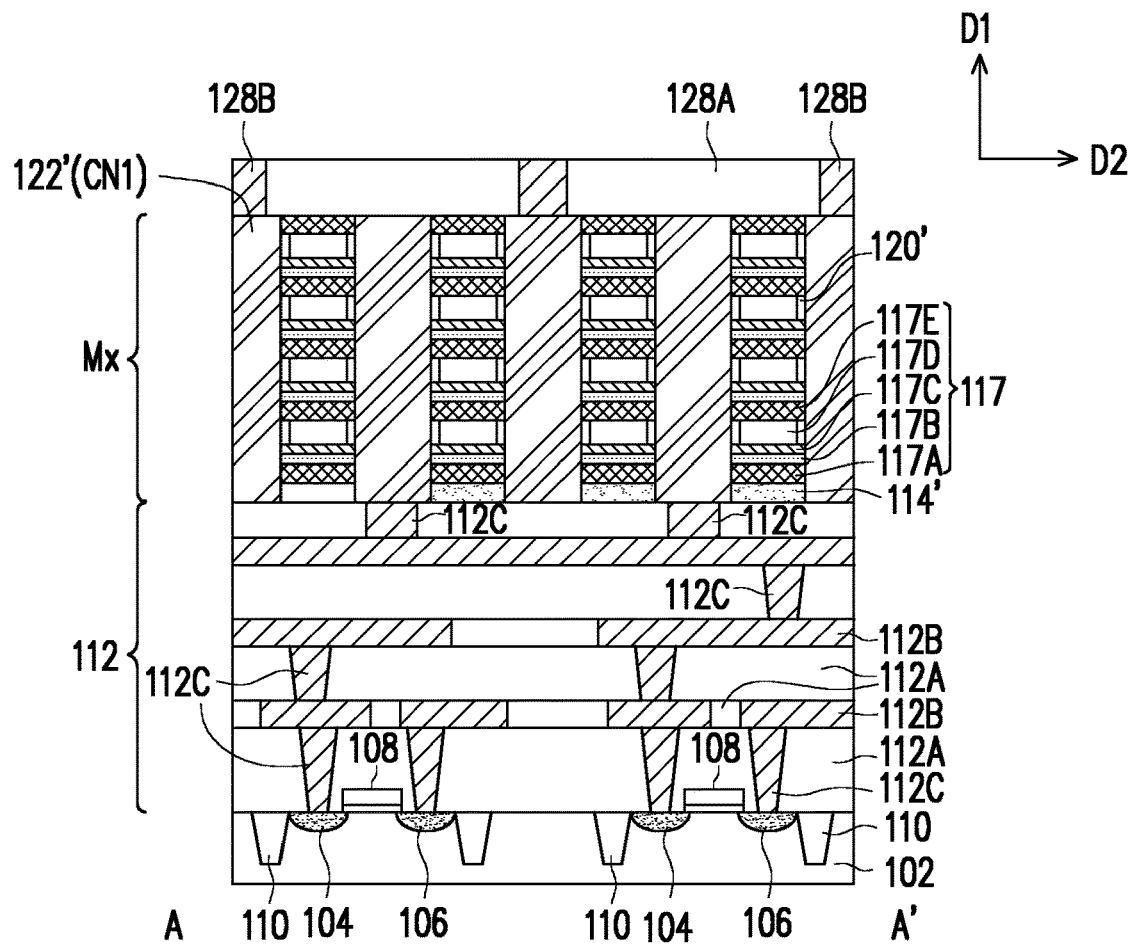
Figure 18C:
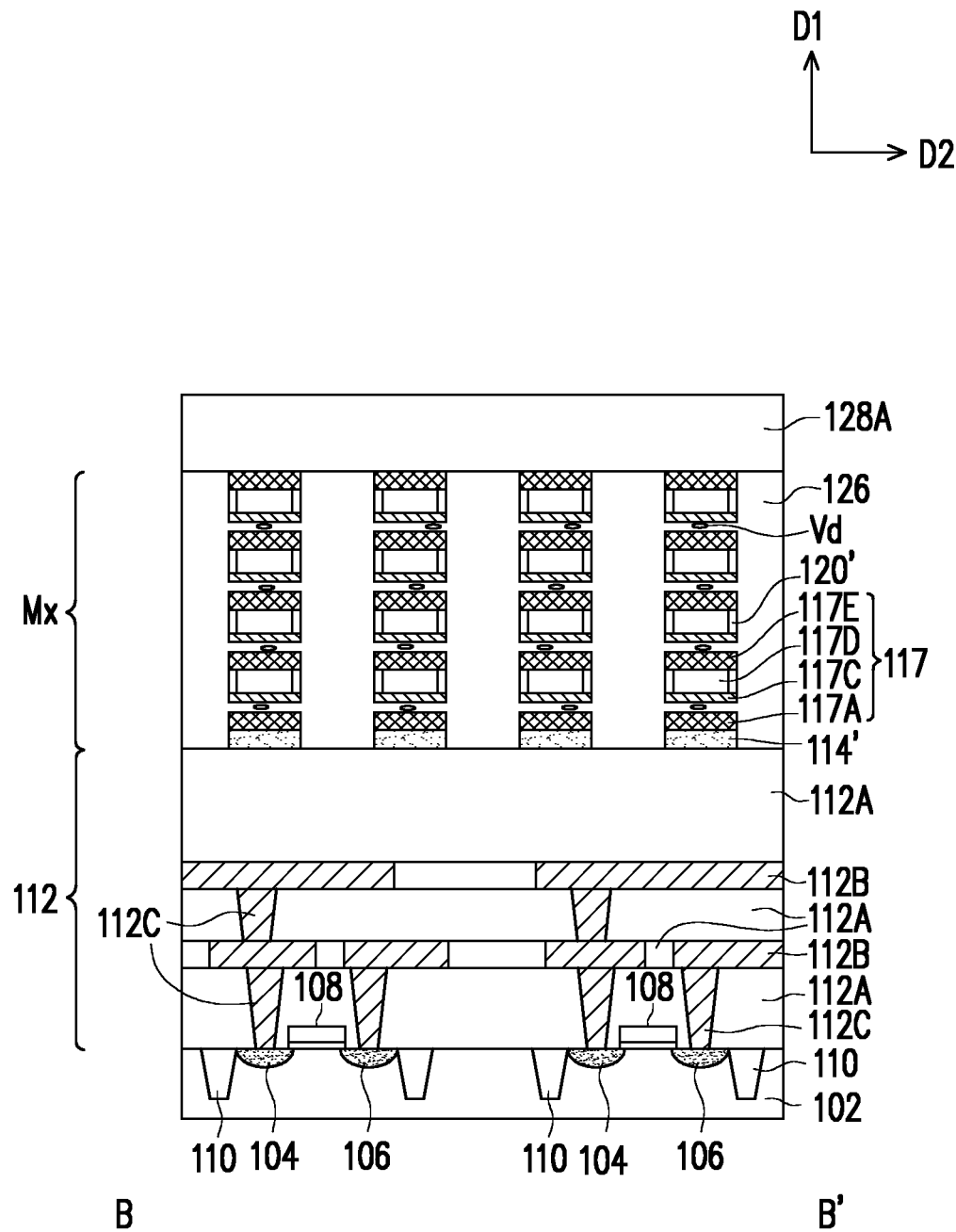

FIG. 18A is a top view of one stage in a method of fabricating a semiconductor device according to some embodiments of the present disclosure. FIG. 18B is a sectional view of the structure shown in FIG. 18A taken along the line A-A'. FIG. 18C is a sectional view of the structure shown in FIG. 18A taken along the line B-B'. Referring to FIG. 18A to FIG. 18C, in a subsequent step, a plurality of second conductive vias 128B are formed to fill the openings of the second inter-metal dielectric layer 128A. In some embodiments, the second conductive vias 128B are formed by electroplating or deposition. In certain embodiments, the second conductive vias 128B are made of conductive materials, such as metals or metal alloys including one or more of Al, AlCu, Cu, Ti, TiN, W, and the like. Furthermore, a planarization process, such as a chemical mechanical polish (CMP) process may be performed so that a top surface of the second conductive vias 128B is coplanar with a top surface of the second inter-metal dielectric layer 128A.

Figure 19A:
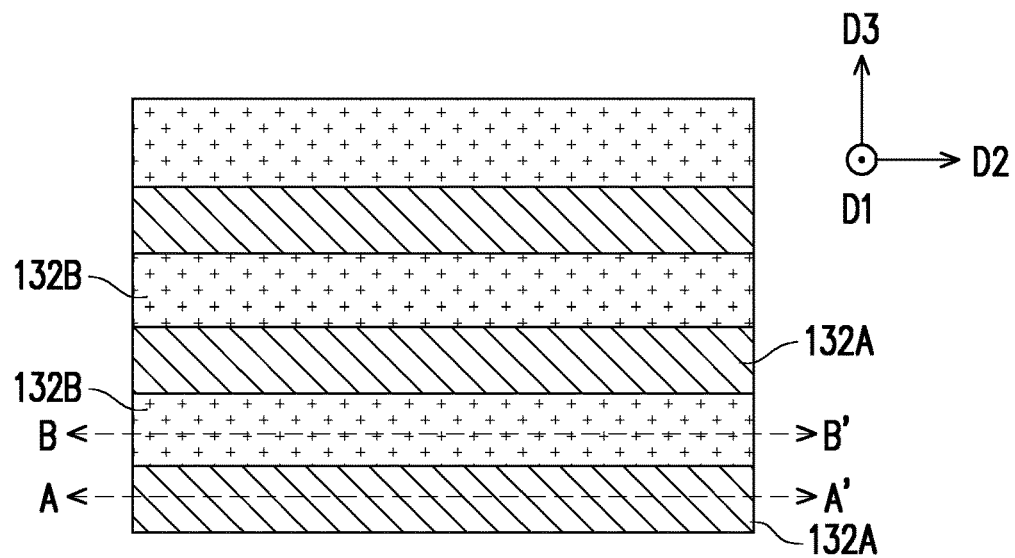
Figure 19B:
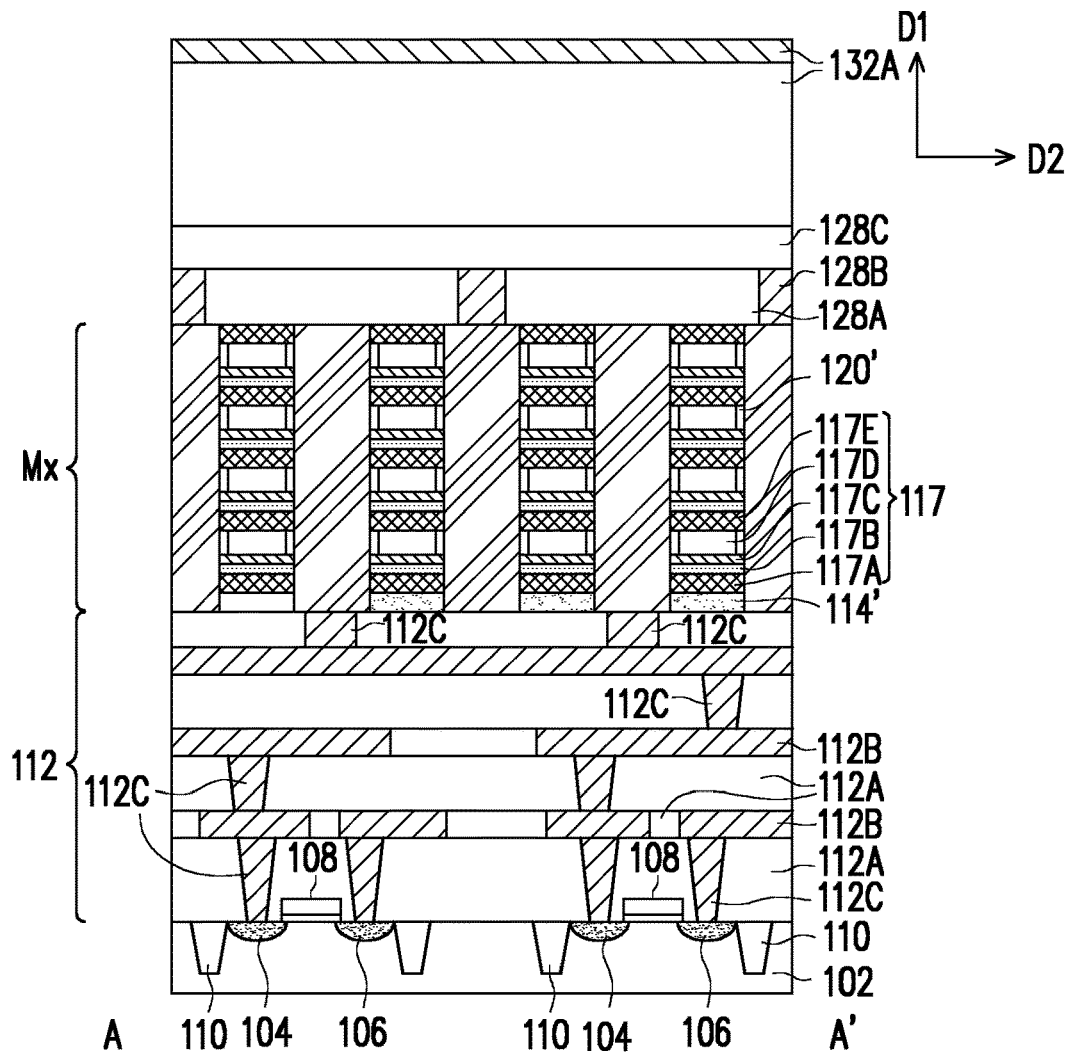
Figure 19C:
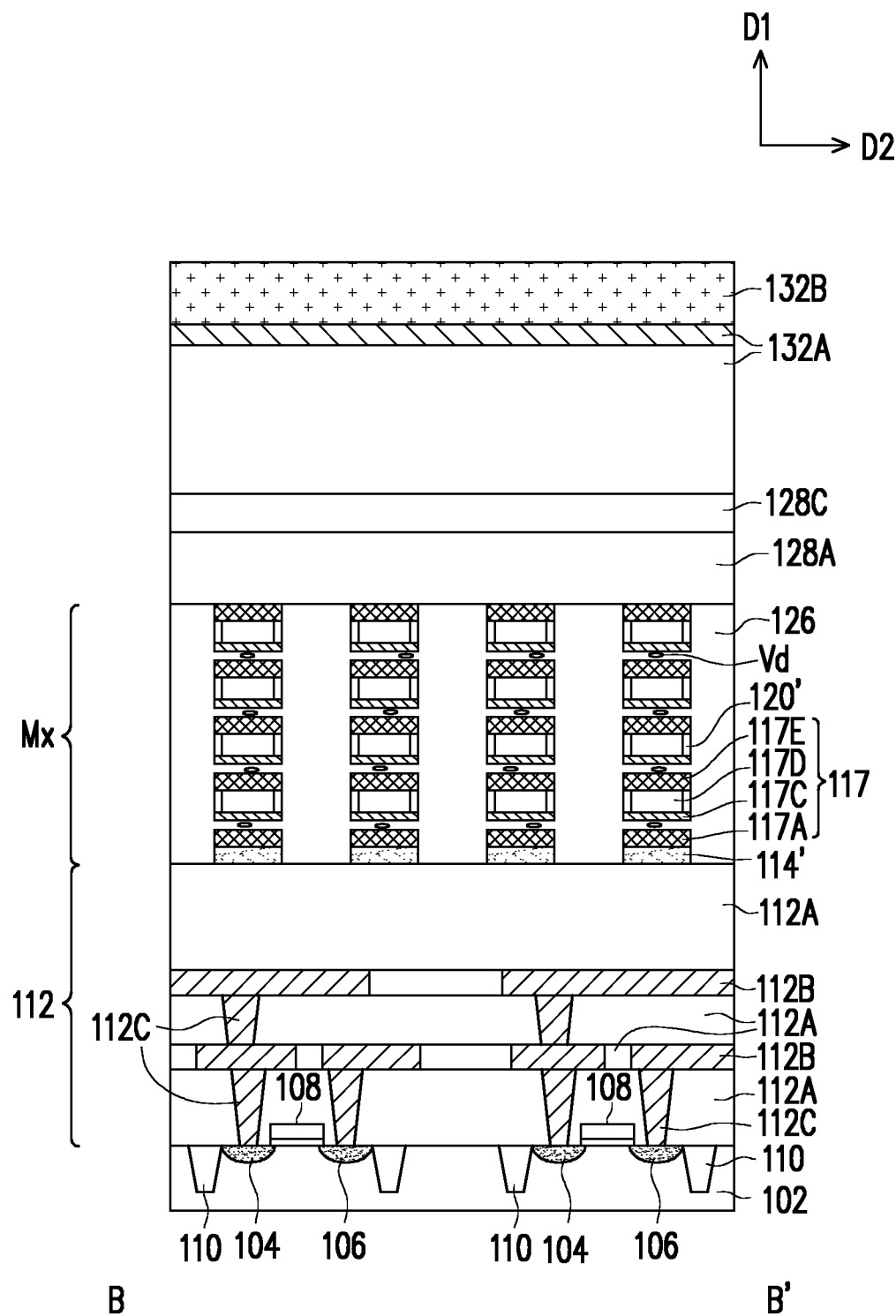

FIG. 19A is a top view of one stage in a method of fabricating a semiconductor device according to some embodiments of the present disclosure. FIG. 19B is a sectional view of the structure shown in FIG. 19A taken along the line A-A'. FIG. 19C is a sectional view of the structure shown in FIG. 19A taken along the line B-B'. Referring to FIG. 19A to FIG. 19C, after forming the plurality of second conductive vias 128B, another second inter-metal dielectric layer 128C, mask layers 132A and a patterned photoresist layer 132B are sequentially formed over the second inter-metal dielectric layer 128A.

The second inter-metal dielectric layer 128C is formed in the same way, and made of the same material as the second inter-metal dielectric layer 128A. Therefore, the detailed description of the second inter-metal dielectric layer 128C will not be repeated herein. In some embodiments, the mask layers 132A are silicon nitride layers, or silicon oxide layers formed, for example, by low-pressure chemical vapor deposition (LPCVD) or plasma enhanced chemical vapor deposition (PECVD). The mask layers 132A are used as a hard mask during subsequent photolithography processes. In certain embodiments, the patterned photoresist layer 132B having a predetermined pattern is formed on the mask layers 132A.

Figure 20A:
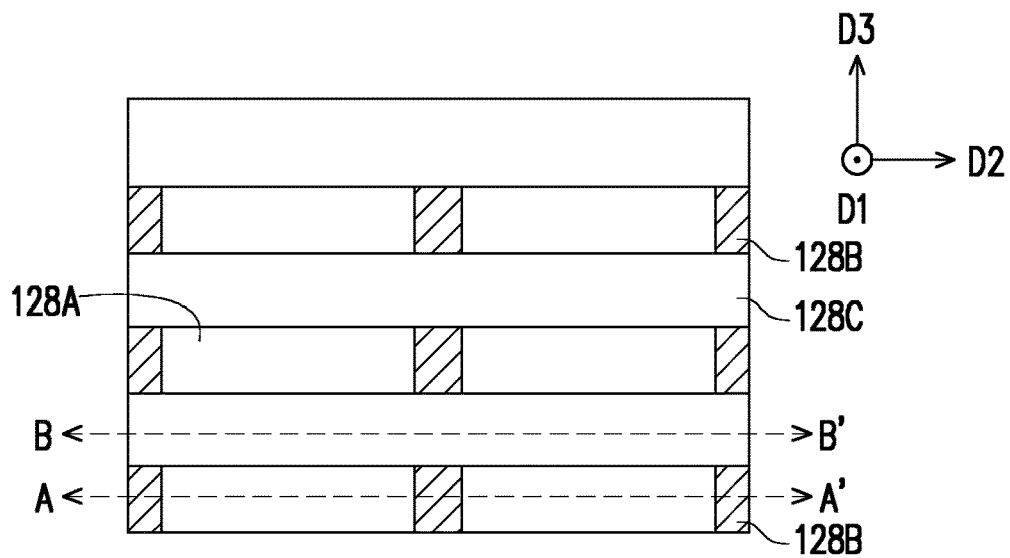
Figure 20B:
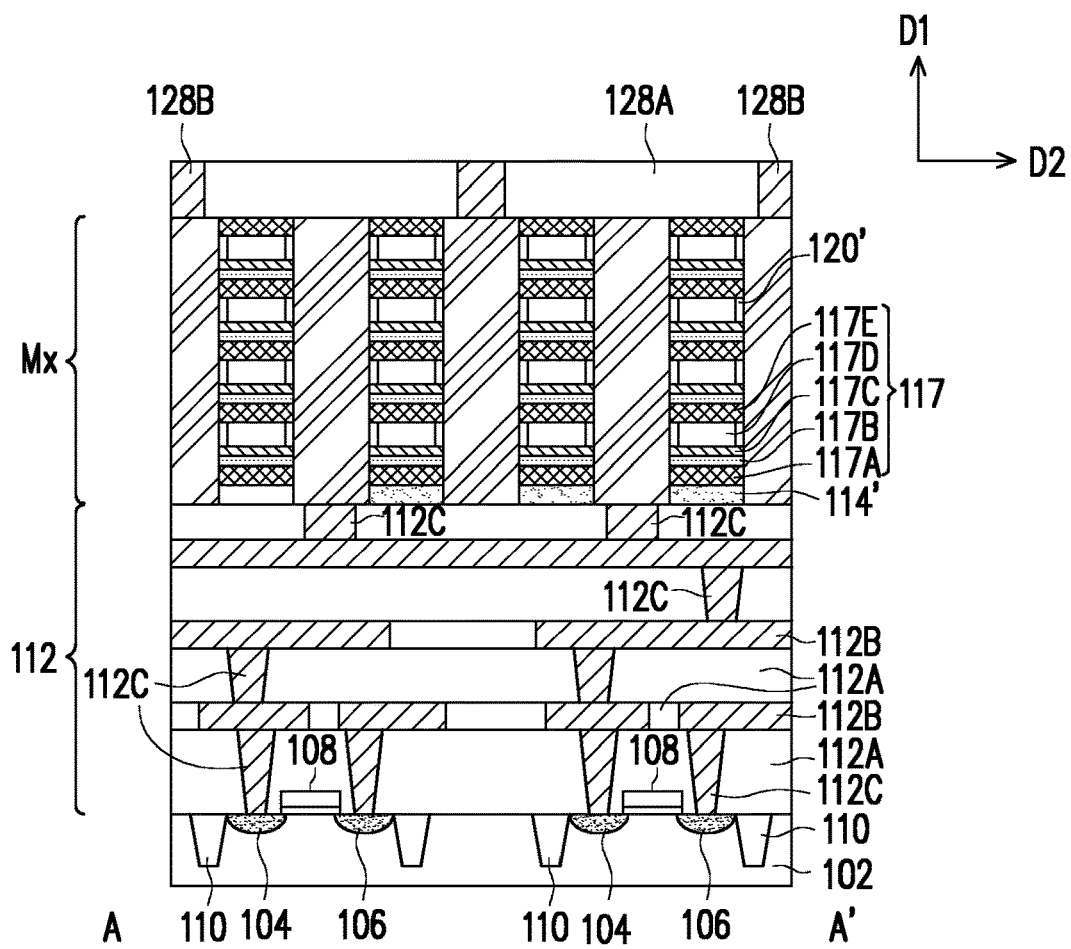
Figure 20C:
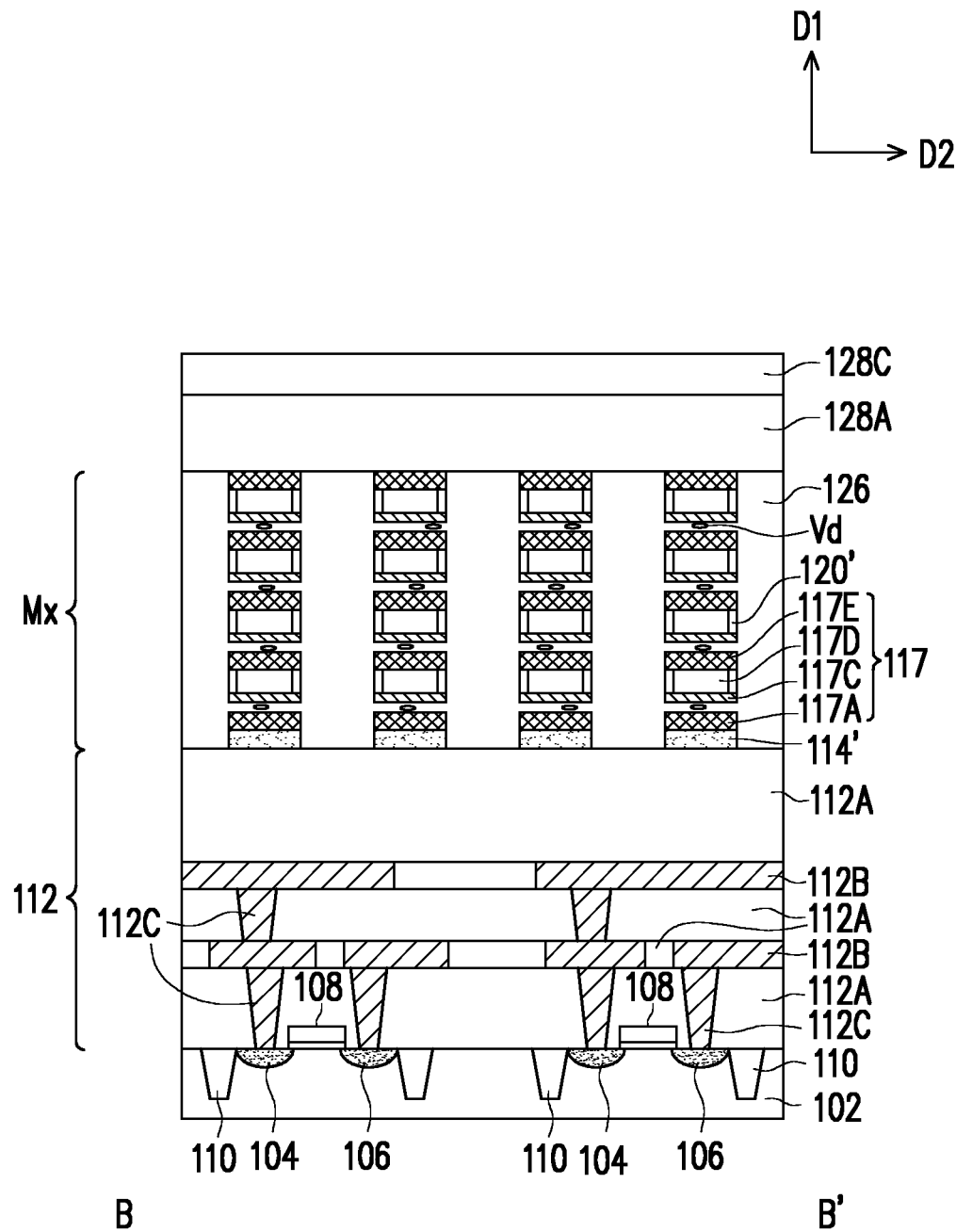

FIG. 20A is a top view of one stage in a method of fabricating a semiconductor device according to some embodiments of the present disclosure. FIG. 20B is a sectional view of the structure shown in FIG. 20A taken along the line A-A'. FIG. 20C is a sectional view of the structure shown in FIG. 20A taken along the line B-B'. Referring to FIG. 20A to FIG. 20C, the second inter-metal dielectric layer 128C is patterned to form openings that reveal the second inter-metal dielectric layer 128A and the second conductive vias 128B located underneath. For example, portions of the second inter-metal dielectric layer 128C not covered by the patterned photoresist layer 132B are etched to expose the second inter-metal dielectric layer 128A and the second conductive vias 128B.

Figure 21A:
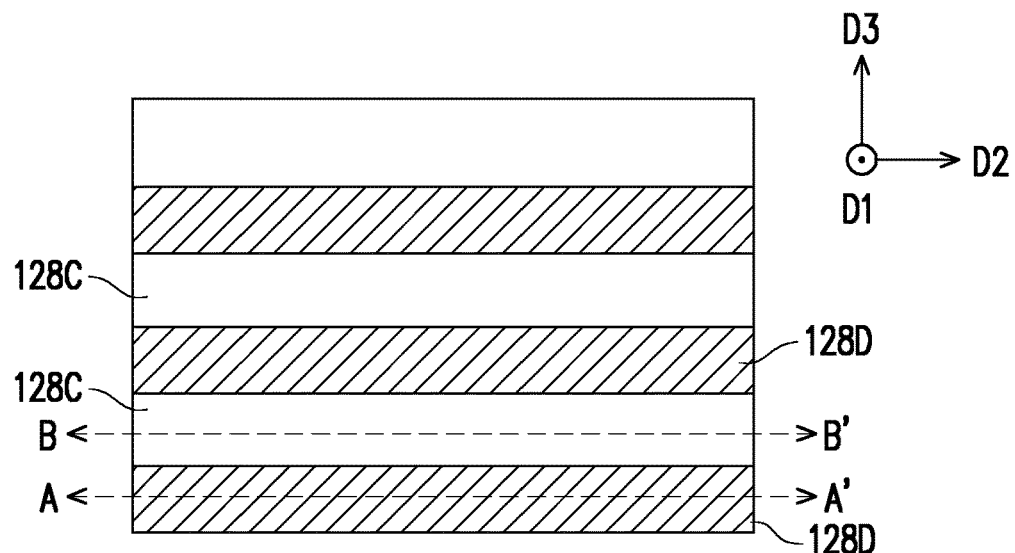
Figure 21B:
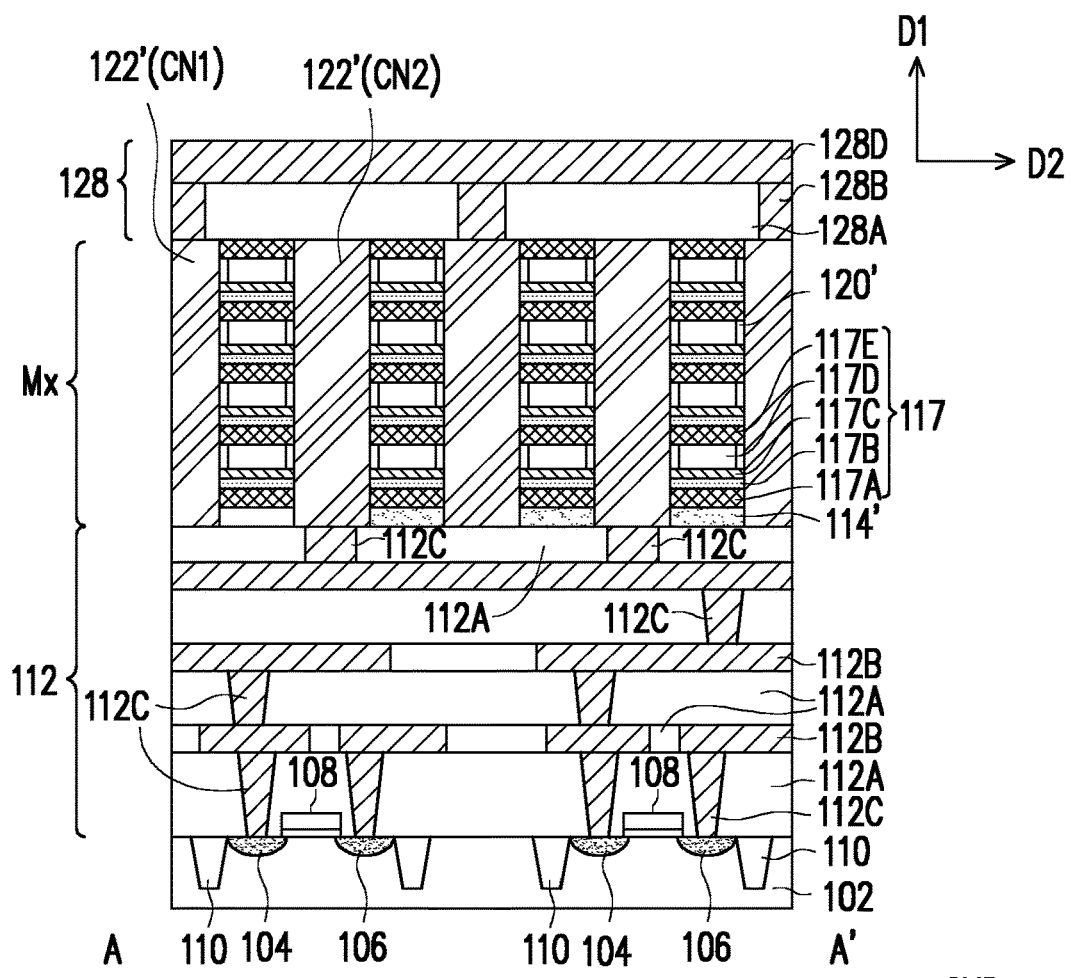
Figure 21C:
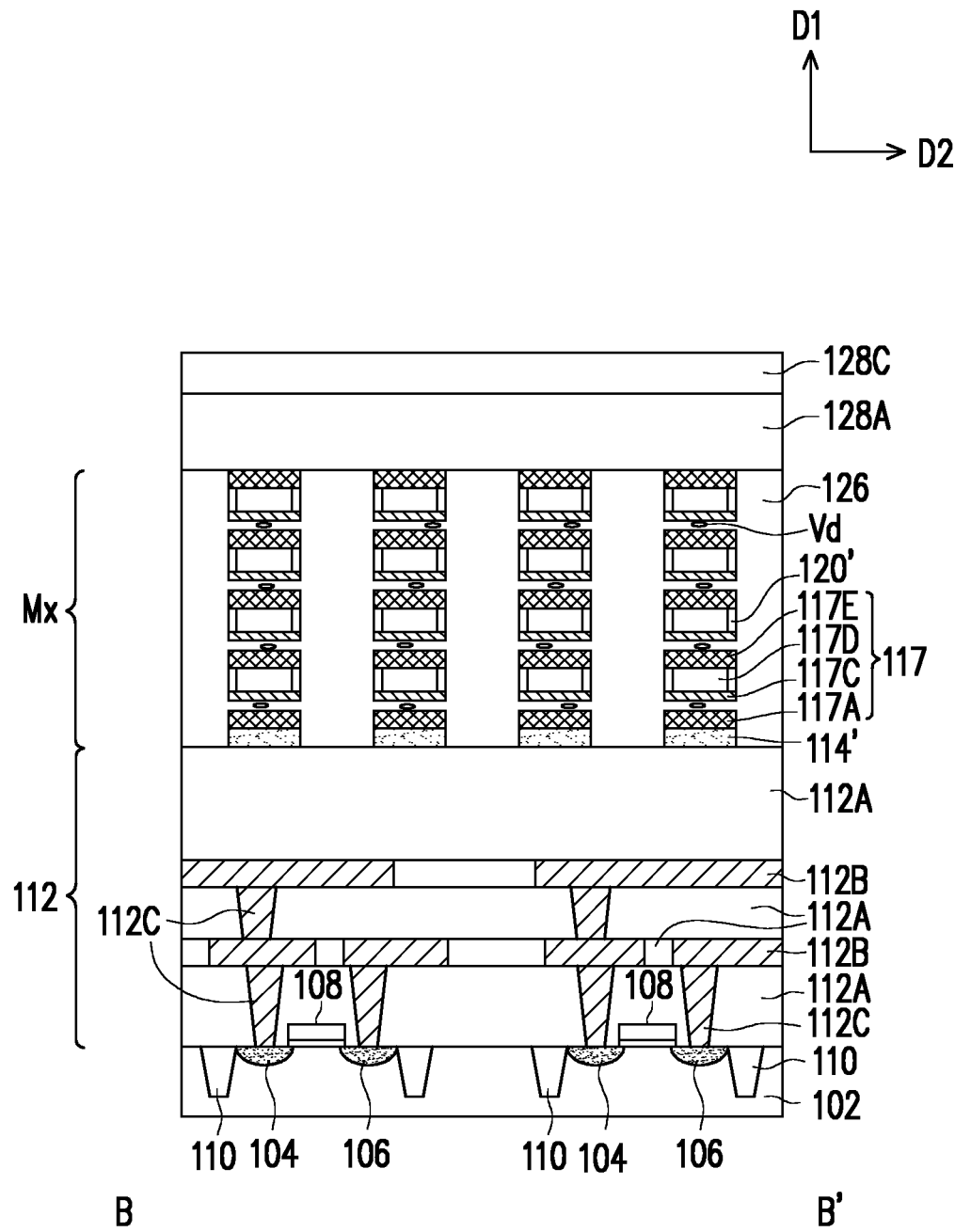

FIG. 21A is a top view of one stage in a method of fabricating a semiconductor device according to some embodiments of the present disclosure. FIG. 21B is a sectional view of the structure shown in FIG. 21A taken along the line A-A'. FIG. 21C is a sectional view of the structure shown in FIG. 21A taken along the line B-B'. Referring to FIG. 21A to FIG. 21C, in a subsequent step, a second conductive layer 128D is formed to fill the openings of the second inter-metal dielectric layer 128C. In some embodiments, the second conductive layer 128D is formed by electroplating or deposition. In certain embodiments, the second conductive layer 128D is made of conductive materials, such as metals or metal alloys including one or more of Al, AlCu, Cu, Ti, TiN, W, and the like. Furthermore, a planarization process, such as a chemical mechanical polish (CMP) process may be performed so that a top surface of the second conductive layer 128D is coplanar with a top surface of the second inter-metal dielectric layer 128C.

After forming the second conductive layer 128D, a semiconductor device SMD according to some embodiments of the present disclosure is accomplished. For example, the semiconductor device SMD may be a NOR flash memory device. In some embodiments, the second inter-metal dielectric layers 128A, 128C, the second conductive vias 128B and the second conductive layer 128D are collectively referred as a second interconnection layer 128. For example, the second interconnection layer 128 is disposed on the memory array Mx and connected to the connecting lines 122' (first connecting line CN1) of the memory array Mx.

In the illustrated embodiment, the memory array Mx is disposed in between the first interconnection layer 112 and the second interconnection layer 128 and connected to the first interconnection layer 112 and the second interconnection layer 128. For example, the first connecting lines CN1 of the memory array Mx are connected to the plurality of second conductive vias 128B of the second interconnection layer 128, and are in contact with one of the plurality of first inter-metal dielectric layers 112A of the first interconnection layer 112. Furthermore, the second connecting lines CN2 are connected to the plurality of first conductive vias 112C of the first interconnection layer 112, and are in contact with the second inter-metal dielectric layer 128A. In some embodiments, the first connecting lines CN1 are source lines, while the second connecting lines CN2 are bit lines. In other words, the source lines are connected to the second interconnection layer 128 while the bit lines are connected to the first interconnection layer 112. However, the disclosure is not limited thereto. For example, in some other embodiments, the first connecting lines CN1 are bit lines, while the second connecting lines CN2 are source lines. In other words, the bit lines are connected to the second interconnection layer 128 while the source lines are connected to the first interconnection layer 112.

In the above-mentioned embodiments, a memory array includes a plurality of stacked memory cells. Each of the memory cells include a memory stack, with connecting lines and insulating layers surrounding the memory stack. As such, when using the memory array in a semiconductor device, it may be functioned as a NOR flash memory device having a three-dimensional structural configuration. Compared to two-dimensional NOR flash, a cell density of the memory device of the present disclosure is greatly improved. As a result of the circuit configuration of NOR flash, the semiconductor device (memory device) of the present disclosure may achieve higher read speed over NAND flash. In addition, with the three-dimensional structural configuration, the cell density of the memory device of the present disclosure can compete with a cell density of NAND flash with lower bit-cost. Accordingly, the semiconductor device of the present disclosure is ideal for high-end memory applications such as artificial intelligence (AI) and automotive electronics.

In accordance with some embodiments of the present disclosure, a memory array includes a plurality of memory cells stacked up along a first direction. Each of the memory cells include a memory stack, connecting lines, and insulating layers. The memory stack includes a first dielectric layer, a channel layer disposed on the first dielectric layer, a charge trapping layer disposed on the channel layer, a second dielectric layer disposed on the charge trapping layer, and a gate layer disposed in between the channel layer and the second dielectric layer. The connecting lines are extending along the first direction and covering side surfaces of the memory stack. The insulating layers are extending along the first direction, wherein the insulating layers are located aside the connecting lines and covering the side surfaces of the memory stack.

In accordance with some other embodiments of the present disclosure, a semiconductor device includes a substrate, a gate stack, a first interconnection layer, a memory array and a second interconnection layer. The substrate has source and drain regions. The gate stack is disposed on the substrate. The first interconnection layer is disposed on the substrate over the gate stack, wherein the first interconnection layer is connected to the source and drain regions. The memory array is disposed on the first interconnection layer, wherein the memory array includes at least a first column of stacked memory cells and a second column of stacked memory cells arranged side by side. Each of the memory cells stacked up in the first column and the second column includes a memory stack, a first connecting, a second connecting line, and insulating layers. The memory stack includes a first dielectric layer, a channel layer, a charge trapping layer, a gate layer and a second dielectric layer stacked up in sequence along a first direction. The first connecting line is located on a first side surface of the memory stack. The second connecting line is located on a second side surface of the memory stack opposite to the first side surface and connected to the first interconnection layer. The insulating layers is covering the first side surface and the second side surface of the memory stack. The second interconnection layer is disposed on the memory array and connected to the first connecting line of the memory array.

In accordance with yet another embodiment of the present disclosure, a method of fabricating a memory array is described. The method includes the following steps. A substrate is provided. A plurality of memory layers is formed on the substrate by the following steps. A dielectric material, a channel material, a charge trapping material and a gate material are sequentially formed over the substrate. The formation of the dielectric material, the channel material, the charge trapping material and the gate material are repeated to form the plurality of memory layers. The memory layers are patterned to form a plurality of column structures and a plurality of first trenches in between the plurality of column structures, wherein each of the plurality of column structures comprises a plurality of memory stacks stacked up along a first direction, and each of the plurality of memory stacks comprises a first dielectric layer, a channel layer, a charge trapping layer, a gate layer and a second dielectric layer stacked up in sequence. Connecting lines are formed in the plurality of first trenches aside the plurality of memory stacks, and the connecting lines are patterned to form a plurality of second trenches. Insulating layers are formed in the plurality of second trenches aside the connecting lines and aside the plurality of memory stacks.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a memory array, comprising:
providing a substrate;
forming a plurality of memory layers, comprising:
sequentially forming a dielectric material, a channel material, a charge trapping material and a gate material over the substrate;
repeating the formation of the dielectric material, the channel material, the charge trapping material and the gate material to form the plurality of memory layers;
patterning the plurality of memory layers to form a plurality of column structures and a plurality of first trenches in between the plurality of column structures, wherein each of the plurality of column structures comprises a plurality of memory stacks stacked up along a first direction, and each of the plurality of memory stacks comprises a first dielectric layer, a channel layer, a charge trapping layer, a gate layer and a second dielectric layer stacked up in sequence;
forming connecting lines in the plurality of first trenches aside the plurality of memory stacks, and patterning the connecting lines to form a plurality of second trenches; and
forming insulating layers in the plurality of second trenches aside the connecting lines and aside the plurality of memory stacks.

2. The method of fabricating a memory array according to claim 1, wherein after the patterning the connecting lines to form a plurality of second trenches, and prior to forming the insulating layers, the method further comprises:
performing a lateral etching to remove portions of the channel layer in each of the plurality of memory stacks, wherein a gap is formed in between the charge trapping layer and the first dielectric layer after the lateral etching.

3. The method of fabricating a memory array according to claim 2, wherein forming the insulating layers further comprises:
filling the insulating layers in the gap between the charge trapping layer and the first dielectric layer to form gap filling portions, wherein voids exist in the gap filling portions of the insulating layers.

4. The method of fabricating a memory array according to claim 1, wherein after the patterning the plurality of memory layers to form the plurality of column structures and the plurality of first trenches, and prior to forming the connecting lines, the method further comprises:
performing a lateral etching to remove portions of the gate layer to form a plurality of recesses in the plurality of column structures; and
forming an isolation layer in the plurality of recesses to surround the gate layer.

5. The method of fabricating a memory array according to claim 4, wherein forming the isolation layer comprises:
forming an isolation material in the plurality of first trenches and into the plurality of recesses; and
patterning the isolation material by removing portions of the isolation material in the plurality of first trenches so that the isolation material retained in the plurality of recesses forms the isolation layer.

6. The method of fabricating a memory array according to claim 5, wherein after patterning the isolation material to form the isolation layer, sidewalls of the isolation layer are aligned with sidewalls of the first dielectric layer, sidewalls of the channel layer, sidewalls of the charge trapping layer and sidewalls of the second dielectric layer.

7. The method of fabricating a memory array according to claim 1, wherein after patterning the connecting lines, the connecting lines are arranged along a second direction that is perpendicular to the first direction, and the connecting lines are separated from one another by the plurality of column structures.

8. A method of fabricating a semiconductor device, comprising:
providing a substrate having source and drain regions;
forming a gate stack on the substrate;
forming a first interconnection layer on the substrate and over the gate stack, wherein the first interconnection layer is connected to the source and drain regions;
forming a memory array on the first interconnection layer, wherein forming the memory array comprises:
forming at least a first column of memory stack and a second column of memory stack arranged side by side, wherein each of the first column of memory stack and the second column of memory stack comprises a first dielectric layer, a channel layer, a charge trapping layer, a gate layer and a second dielectric layer stacked up in sequence along a first direction;
forming a first connecting line located on a first side surface of the first column of memory stack;
forming a second connecting line located on a second side surface of the first column of memory stack, in between the first column of memory stack and the second column of memory stack, wherein the second connecting line is connected to the first interconnection layer; and
forming a second interconnection layer disposed on the memory array and connected to the first connecting line of the memory array.

9. The method of fabricating a semiconductor device according to claim 8, further comprising patterning the first connecting line and the second connecting line, and forming insulating layers aside the first connecting line and the second connecting line, wherein the insulating layers are covering the first side surface and the second side surface of the first column of memory stack.

10. The method of fabricating a semiconductor device according to claim 9, further comprising:
performing lateral etching to remove portions of the channel layer in each of the plurality of memory stacks, wherein a gap is formed in between the charge trapping layer and the first dielectric layer after the lateral etching; and
filling the insulating layers in the gap between the charge trapping layer and the first dielectric layer to form gap filling portions, wherein voids exist in the gap filling portions of the insulating layers.

11. The method of fabricating a semiconductor device according to claim 8, further comprising:
performing lateral etching to remove portions of the gate layer to form a plurality of recesses in the first column of memory stack and the second column of memory stack; and
forming an isolation layer in the plurality of recesses to surround the gate layer in the first column of memory stack and the second column of memory stack.

12. The method of fabricating a semiconductor device according to claim 11, wherein forming the isolation layer comprises:
forming an isolation material aside the first column of memory stack and the second column of memory stack prior to forming the first connecting line and the second connecting line, and filling the isolation material into the plurality of recesses;
and patterning the isolation material by removing portions of the isolation material in the plurality of first trenches so that the isolation material retained in the plurality of recesses forms the isolation layer.

13. The method of fabricating semiconductor device according to claim 12, wherein after patterning the isolation material to form the isolation layer, sidewalls of the isolation layer are aligned with sidewalls of the first dielectric layer, sidewalls of the channel layer, sidewalls of the charge trapping layer and sidewalls of the second dielectric layer.

14. The method of fabricating a semiconductor device according to claim 8, further comprising:
forming a third column of memory stack arranged aside the second column of memory stack, wherein the third column of memory stack comprises the first dielectric layer, the channel layer, the charge trapping layer, the gate layer and the second dielectric layer stacked up in sequence along the first direction; and
forming a third connecting line located in between the second column of memory stack and the third column of memory stack, wherein the second interconnection layer is connected to the third connecting line.

15. A method of fabricating a semiconductor device, comprising:
forming a first interconnection layer over a substrate;
forming a memory array over and electrically connected to the first interconnection layer, wherein forming the memory array comprises forming at least a first memory cell by:
forming a first dielectric layer, a channel layer, a charge trapping layer, a gate layer and a second dielectric layer stacked up in sequence along a first direction;
performing lateral etching to remove portions of the gate layer to form a recessed gate layer;
forming an isolation layer to surround the recessed gate layer;
forming a source line and a bit line on two sides of the first dielectric layer, the channel layer, the charge trapping layer, the isolation layer and the second dielectric layer; and
forming a second interconnection layer disposed on and electrically connected to the memory array.

16. The method of fabricating a semiconductor device according to claim 15, wherein the isolation layer is formed so that sidewalls of the isolation layer are aligned with sidewalls of the first dielectric layer, sidewalls of the channel layer, sidewalls of the charge trapping layer and sidewalk of the second dielectric layer.

17. The method of fabricating a semiconductor device according to claim 15, further comprising:
performing lateral etching to remove portions of the channel layer in each of the plurality of memory stacks, wherein a gap is formed in between the charge trapping layer and the first dielectric layer after the lateral etching; and
forming insulating layers aside the source line and the bit line, and filling the insulating layers in the gap between the charge trapping layer and the first dielectric layer to form gap filling portions.

18. The method of fabricating a semiconductor device according to claim 17, wherein the insulating layers are formed with voids existing in the gap filling portions.

19. The method of fabricating a semiconductor device according to claim 15, wherein the bit line is formed to be electrically connected to the first interconnection layer, and the second interconnection layer is formed to be electrically connected to the source line.

20. The method of fabricating a semiconductor device according to claim 15, further comprising:
forming a second memory cell over the first memory cell by:
forming a second channel layer, a second charge trapping layer, a second gate layer and a third dielectric layer stacked up in sequence along the first direction over the second dielectric layer of the first memory cell;
performing lateral etching to remove portions of the second gate layer to form a second recessed gate layer;
forming a second isolation layer to surround the second recessed gate layer; and
forming the source line and the bit line so that they are shared between the first memory cell and the second memory cell.

* * * * *